US012733284B2

(12) United States Patent
Um

(10) Patent No.: US 12,733,284 B2
(45) Date of Patent: Sep. 8, 2026

(54) IMAGE SENSOR INCLUDING THREE SUBSTRATES

(71) Applicant: SAMSUNG ELECTRONICS CO., LTD., Suwon-si (KR)

(72) Inventor: Changyong Um, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 961 days.

(21) Appl. No.: 17/897,775

(22) Filed: Aug. 29, 2022

(65) Prior Publication Data

US 2023/0163151 A1 May 25, 2023

(30) Foreign Application Priority Data

Nov. 23, 2021 (KR) ........................ 10-2021-0162466

(51) Int. Cl.
*H01L 27/146* (2006.01)
*H10F 39/00* (2025.01)

(52) U.S. Cl.
CPC ....... *H10F 39/811* (2025.01); *H10F 39/8037* (2025.01); *H10F 39/8053* (2025.01); *H10F 39/8063* (2025.01); *H10F 39/807* (2025.01)

(58) Field of Classification Search
CPC ...................................................... H10F 39/811
See application file for complete search history.

(56) References Cited

U.S. PATENT DOCUMENTS 10,090,342 B1 10/2018 Gambino et al.
10,090,349 B2 10/2018 Wan et al.
10,163,946 B2 12/2018 Kwon
10,763,294 B2 9/2020 Lee et al.
10,834,347 B2 11/2020 Jung et al.
10,964,740 B2 3/2021 Choi et al.
11,024,663 B2 6/2021 Tsugawa et al.
2014/0042298 A1 * 2/2014 Wan ...................... H10F 39/809
257/E31.127

(Continued)

FOREIGN PATENT DOCUMENTS

KR 1020140020708 A 2/2014
KR 1020190103806 A 9/2019

(Continued)

*Primary Examiner* — Peter Bradford

(74) *Attorney, Agent, or Firm* — Muir Patent Law, PLLC

(57) ABSTRACT

An image sensor may include a first substrate having first and second surfaces opposite to each other and including a floating diffusion region provided near the first surface, a second substrate provided on the first surface of the first substrate, an intermediate substrate disposed between the first and second substrates, a first transistor disposed on a bottom surface of the intermediate substrate, a contact pattern electrically connecting the first transistor to the floating diffusion region, an upper interconnection layer provided on a bottom surface of the intermediate substrate, a lower interconnection layer between the upper interconnection layer and the second substrate, conductive pads electrically connecting the upper and lower interconnection layers, and a capacitor disposed on the second substrate. The contact pattern may penetrate the intermediate substrate and may be in contact with the floating diffusion region. The capacitor may be closer to the second substrate than the conductive pads.

20 Claims, 17 Drawing Sheets

(56) References Cited

U.S. PATENT DOCUMENTS

| | | | | |
|---|---|---|---|---|
| 2019/0267423 | A1* | 8/2019 | Lee | H04N 25/79 |
| 2020/0119099 | A1* | 4/2020 | Shibuta | H10F 39/191 |
| 2021/0043671 | A1 | 2/2021 | Yoneda et al. | |
| 2021/0084249 | A1* | 3/2021 | Nakazawa | H10F 39/811 |
| 2021/0098392 | A1* | 4/2021 | Wu | H10F 39/024 |
| 2021/0134873 | A1 | 5/2021 | Kwon et al. | |
| 2022/0246653 | A1* | 8/2022 | Tonegawa | H10D 84/00 |
| 2022/0271070 | A1* | 8/2022 | Nakazawa | H04N 25/778 |
| 2023/0013149 | A1* | 1/2023 | Akiyama | H10F 39/8063 |
| 2024/0038807 | A1* | 2/2024 | Kurihara | H10F 39/12 |

FOREIGN PATENT DOCUMENTS

| | | | |
|---|---|---|---|
| KR | 1020200039076 | A | 4/2020 |
| KR | 20200097716 | A | 8/2020 |
| WO | WO 2020/059335 | A1 | 3/2020 |

* cited by examiner 100b
110
10
TR1
150
151
153
155
TG
TGb TGa
FD IL
160a
100
WF1
TR2
103a
100a
CTa
GEa
TX
GEa
220
230
221
212
219a
222
20a
213
223
214
WF2
224
225
215
216
226
PAD1
C1
C2
261
PAD2
262
20
236b
257
248
255
247
253
236a
251a
251b
20b
252a
252b
245
234
244
233
243
232
242
231
WF3
CTb
241
103b
219b
160b GEb TR7
40

IMAGE SENSOR INCLUDING THREE SUBSTRATES

CROSS-REFERENCE TO RELATED APPLICATION

This U.S. non-provisional patent application claims priority under 35 U.S.C. § 119 to Korean Patent Application No. 10-2021-0162466, filed on Nov. 23, 2021, in the Korean Intellectual Property Office, the entire contents of which are hereby incorporated by reference.

BACKGROUND

1. Field

Embodiments relate to an image sensor.

2. Description of the Related Art

An image sensor is a device converting an optical image to electrical signals. The image sensor is classified into two types: a charge coupled device (CCD) type and a complementary metal-oxide-semiconductor (CMOS) type. The CMOS-type image sensor is called CIS for short. The CIS includes a plurality of unit pixel regions which are two-dimensionally arranged. Each of the unit pixel regions includes a photodiode, which is used to convert an incident light to an electric signal.

SUMMARY

According to an embodiment, an image sensor may include a first substrate having a first surface and a second surface, which are opposite to each other, the first substrate including a floating diffusion region provided near the first surface of the first substrate, a second substrate provided on the first surface of the first substrate, an intermediate substrate disposed between the first substrate and the second substrate, a first transistor disposed on a bottom surface of the intermediate substrate, a contact pattern electrically connecting the first transistor to the floating diffusion region, an upper interconnection layer provided on a bottom surface of the intermediate substrate, a lower interconnection layer between the upper interconnection layer and the second substrate, conductive pads electrically connecting the upper interconnection layer to the lower interconnection layer, and a capacitor disposed on the second substrate. The contact pattern may be provided to penetrate the intermediate substrate and to be in contact with the floating diffusion region, and the capacitor may be closer to the second substrate than the conductive pads.

According to an embodiment, an image sensor may include a substrate having a first surface and a second surface, which are opposite to each other, and including unit pixel regions, each of which includes a floating diffusion region adjacent to the first surface, an intermediate substrate provided on the first surface of the substrate, a transistor, which is disposed on a bottom surface of the intermediate substrate and is electrically connected to the floating diffusion region through a contact pattern, an upper interconnection layer disposed below the intermediate substrate, a lower semiconductor chip disposed below the upper interconnection layer, the lower semiconductor chip including a lower interconnection layer, which is electrically connected to the upper interconnection layer, and a second substrate, which is disposed below the lower interconnection layer, and a first capacitor in the lower semiconductor chip. The contact pattern may penetrate the intermediate substrate and may have a side surface covered with an insulating pattern. The upper interconnection layer may include a first conductive pad adjacent to the lower interconnection layer, and the lower interconnection layer may include a second conductive pad adjacent to the upper interconnection layer. The first conductive pad and the second conductive pad may be in contact with each other.

According to an embodiment, an image sensor may include a substrate having a first surface and a second surface, which are opposite to each other, and including a pixel array region, an optical black region, and a pad region, a pixel isolation pattern provided on the pixel array region and in the substrate to define unit pixel regions, the pixel isolation pattern including a first isolation pattern and a second isolation pattern interposed between the first isolation pattern and the substrate, a photoelectric conversion region provided in each of the unit pixel regions, a floating diffusion region provided in each of the unit pixel regions and adjacent to the first surface of the substrate, a transfer gate on the first surface of the substrate, an intermediate substrate provided on the first surface of the substrate, a first transistor provided on a bottom surface of the intermediate substrate, the first transistor including a first impurity region provided in the intermediate substrate, an upper interconnection layer disposed below the intermediate substrate, the upper interconnection layer including sequentially-stacked upper insulating layers and upper interconnection patterns in the upper insulating layers, a contact pattern electrically connecting the transistor to the floating diffusion region, the contact pattern penetrating the intermediate substrate and having a side surface covered with an insulating pattern, an anti-reflection layer provided on the second surface of the substrate, a color filter on the anti-reflection layer, a micro lens on the color filter, a lower interconnection layer disposed below the upper interconnection layer, conductive pads electrically connecting the upper interconnection layer to the lower interconnection layer, the conductive pads including a first conductive pad in the upper interconnection layer and a second conductive pad in the lower interconnection layer, a second substrate below the lower interconnection layer, the second substrate including a second transistor disposed on a top surface of the second substrate, and a capacitor provided in the lower interconnection layer to be closer to the second substrate than the conductive pads. The capacitor may include cylindrical bottom electrodes, a top electrode on the bottom electrodes, a dielectric layer between the bottom electrodes and the top electrode, and an upper pad electrode on the top electrode.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described with reference to the accompanying drawings, in which example embodiments are shown.

Figure 1:
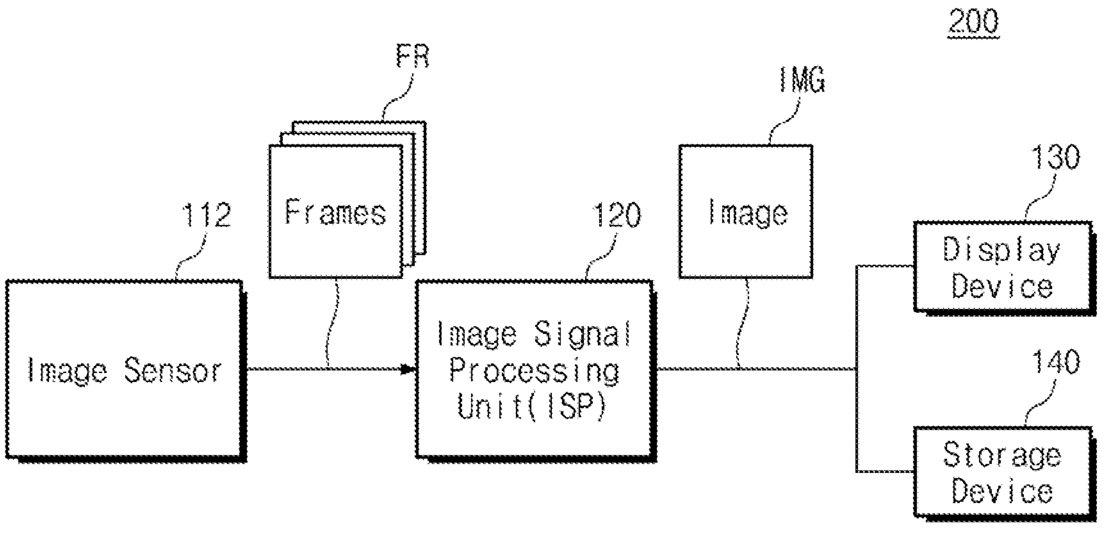
FIG. 1 is a block diagram illustrating an image processing device according to an example embodiment.

FIG. 1 is a block diagram illustrating an image processing device according to an example embodiment.

Referring to FIG. 1, an image processing device 200 may include an image sensor 112, an image signal processing unit (ISP) 120, a display device 130, and a storage device 140.

Examples of the image processing device 200 may include one of electronic devices (e.g., smart phones and digital cameras) which are configured to obtain an image of an external object.

The image sensor 112 may convert light representing the image of the external object into electric signals (e.g., data signals). The image sensor 112 may include a plurality of pixels. Each of the pixels may receive light transmitted from the external object, and may convert the received light to electric signals (e.g., image signals or picture signals).

The image signal processing unit 120 may be configured to correct or process a frame data FR (i.e., image data or picture data), which is received from the image sensor 112, through a signal processing process, and to output an image data IMG generated by the correction process. For example, the image signal processing unit 120 may perform a signal processing operation (e.g., color interpolation, color correction, gamma correction, color space conversion, and edge correction) on the received frame data FR to generate the image data IMG.

The display device 130 may output the image data IMG, which is generated by the image signal processing unit 120, to a user. For example, the display device 130 may include at least one of various display panels (e.g., a liquid crystal display panel, an organic light emitting display panel, an electrophoretic display panel, and an electrowetting display panel). The display device 130 may output the image data IMG to the outside through the display panel.

The storage device 140 may be configured to store the image data IMG, which is generated by the image signal processing unit 120. The storage device 140 may include a volatile memory device (e.g., a static random access memory (SRAM) device, a dynamic RAM (DRAM) device, or a synchronous DRAM (SDRAM) device) or a nonvolatile memory device (e.g., a read only memory (ROM) device, a programmable ROM (PROM) device, an electrically programmable ROM (EPROM) device, an electrically erasable and programmable ROM (EEPROM) device, a FLASH memory device, a phase-change RAM (PRAM) device, a magnetic RAM (MRAM) device, a resistive RAM (RRAM) device, or a ferroelectric RAM (FRAM) device).

Figure 2:
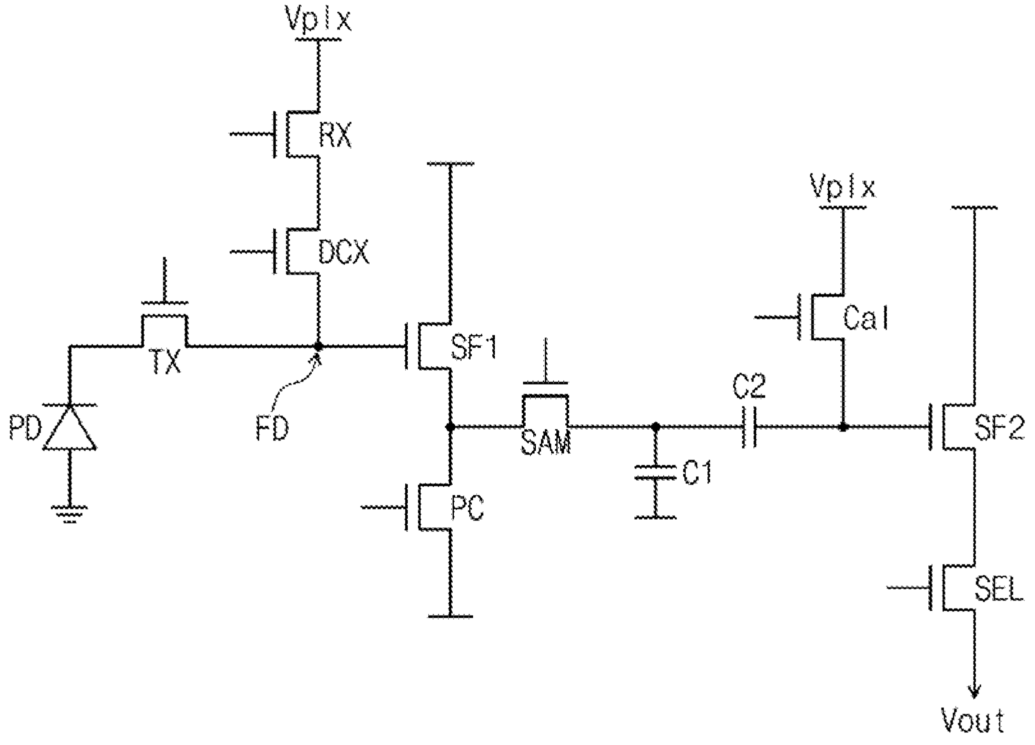
FIG. 2 is a circuit diagram illustrating an image sensor according to an example embodiment.

In an example embodiment, the image sensor 112 may include a capacitor, which is used to store electric charges (i.e., electrical signals) generated by a photoelectric conversion part, as a data storage element. FIG. 2 illustrates an example of a circuit structure of the image sensor. Example embodiments may be applicable to any image sensor with a capacitor.

FIG. 2 is a circuit diagram illustrating an image sensor according to an example embodiment.

Referring to FIG. 2, an image sensor in the present example embodiment may have an in-pixel correlated double sampling (CDS) structure. For example, each of the unit pixel regions of the image sensor may include a photoelectric conversion part PD, a transfer transistor TX, a reset transistor RX, a dual conversion transistor DCX, a first source follower transistor SF1, a pre-charging transistor PC, a sampling transistor SAM, a calibration transistor Cal, a second source follower transistor SF2, a selection transistor SEL, a first capacitor C1, and a second capacitor C2. The photoelectric conversion part PD may be a photodiode including an n-type impurity region and a p-type impurity region. A first terminal of the transfer transistor TX may be connected to the photoelectric conversion part PD. A second terminal of the transfer transistor TX may be connected to a floating diffusion region FD. The floating diffusion region FD may be connected to a first terminal of the dual conversion transistor DCX. A second terminal of the dual conversion transistor DCX may be connected to the reset transistor RX. The floating diffusion region FD may also be electrically connected to a gate electrode of the first source follower transistor SF1. A first terminal of the first source follower transistor SF1 may be connected to the pre-charging transistor PC and the sampling transistor SAM. A first terminal of the sampling transistor SAM may be connected to first electrodes of the first and second capacitors C1 and C2. A second electrode of the second capacitor C2 may be connected to a first terminal of the calibration transistor Cal and a gate electrode of the second source follower transistor SF2. The second source follower transistor SF2 may be connected to the selection transistor SEL.

An operation of the image sensor of FIG. 2 may include a step of sampling a reset value and a step of sampling a signal value. Before a photon accumulation step, the photoelectric conversion part PD may be reset through the floating diffusion region FD. After the reset of the photoelectric conversion part PD, the photon accumulation (e.g., frame capture) step may be started. After the photon accumulation step, the floating diffusion region FD may be reset with a pixel power voltage Vpix. This may induce a noise component in the reset value. The reset value including the noise component may be sampled in the first capacitor C1 and the second capacitor C2 through the first source follower transistor SF1 and the sampling transistor SAM. When the sampling step is started, the first capacitor C1 and the second capacitor C2 may be pre-charged to remove their previously sampled voltages and to allow the first source follower transistor SF1 to sample a new voltage. The pre-charging operation may be executed using the pre-charging transistor PC. During the sampling step, the calibration transistor Cal may be turned off.

After the sampling step, electric charges may be transferred from the photoelectric conversion part PD to the floating diffusion region FD, and thus, the floating diffusion region FD may have a new voltage (hereinafter, a second voltage). The second voltage of the floating diffusion region FD may be sampled in the first capacitor C1 through the first source follower transistor SF1 and the sampling transistor SAM. As a result, a voltage value of the first capacitor C1 may become a new value lower than a previous reset value, which is determined by an amount of charges that are transmitted. Since, during the sampling step, a right node of the second capacitor C2 is in a floating state, a charge amount of the second capacitor C2 may be maintained to the same state as in the reset sampling step. This means that the right node of the second capacitor C2 has a potential that is lowered, by a voltage drop on a left node of the second capacitor C2, from the corrected voltage (e.g., Vpix). When the reset noise is sampled during the reset sampling step, the right node of the second capacitor C2 may be corrected to a fixed voltage (e.g., Vpix) always, and thus, it may not include any noise component. This means that the output value Vout of the pixel does not include a noise component, and the CDS operation may be effectively performed in the pixel. In the image sensor of this structure, it may be possible to reduce a noise component and realize a fast operation.

In an example embodiment, the image sensor may be operated in a global shutter mode. In the global shutter mode, electrical signals (i.e., data), which are generated by all pixels of the image sensor, may be sampled/stored in the first capacitors C1 and/or the second capacitors C2, which are provided in the pixels, simultaneously and respectively, and the image signal processing unit 120 of FIG. 1 may read out data sequentially in order of column or row. Accordingly, the global shutter mode may be realized. The image sensor according to an example embodiment may be referred to as a voltage-type global shutter image sensor.

Figure 3:
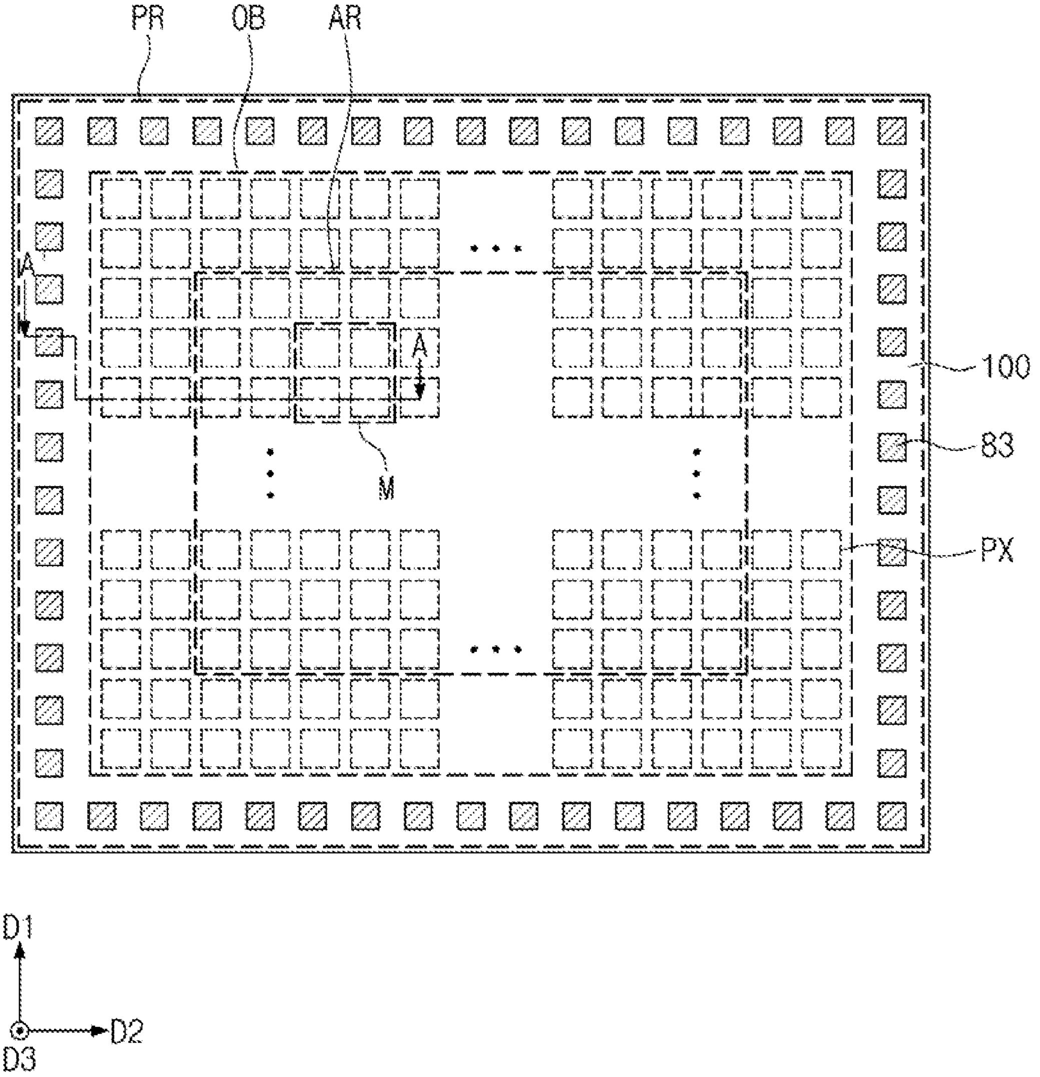
FIG. 3 is a plan view illustrating an image sensor according to an example embodiment.
Figure 4:
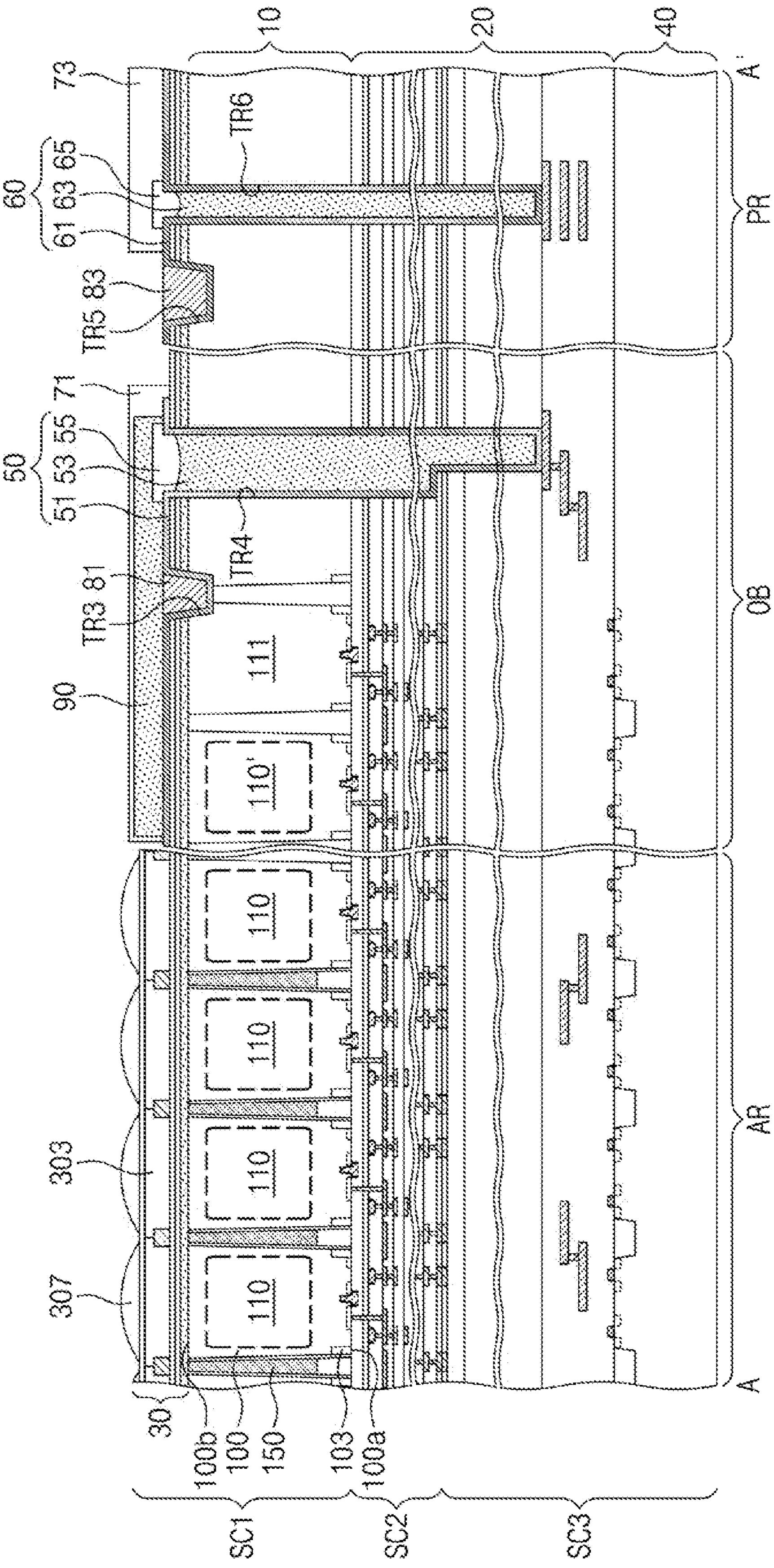
FIG. 4 is a sectional view taken along a line A-A' of FIG. 3.

FIG. 3 is a plan view illustrating an image sensor according to an example embodiment. FIG. 4 is a sectional view taken along a line A-A' of FIG. 3.

Referring to FIGS. 3 and 4, an image sensor may include a photoelectric conversion layer 10, an interconnection layer 20, and an optically-transparent layer 30. The photoelectric conversion layer 10 may include a first substrate 100, a pixel isolation pattern 150, a device isolation pattern 103, and photoelectric conversion regions 110 provided in the first substrate 100. The photoelectric conversion regions 110 may convert light, which is incident from the outside, to electrical signals.

The first substrate 100 may include a pixel array region AR, an optical black region OB, and a pad region PR, when viewed in a plan view. The pixel array region AR may be disposed to be overlapped with a center portion of the first substrate 100, when viewed in a plan view. The pixel array region AR may include a plurality of unit pixel regions PX. The unit pixel regions PX may be configured to output photoelectric signals, which are generated from the incident light. The unit pixel regions PX may be two-dimensionally arranged to form a plurality of columns and a plurality of rows. The columns may be parallel to a first direction D1. The rows may be parallel to a second direction D2. In the present specification, the first direction D1 may be parallel to a first surface 100*a* of the first substrate 100. The second direction D2 may be parallel to the first surface 100*a* of the first substrate 100 but may not be parallel to the first direction D1. A third direction D3 may be substantially perpendicular to the first surface 100*a* of the first substrate 100.

The pad region PR may be provided at an edge portion of the first substrate 100 to enclose the pixel array region AR, when viewed in a plan view. Second pad terminals 83 may be provided on the pad region PR. The second pad terminals 83 may be used to output electrical signals, which are produced in the unit pixel regions PX, to the outside. In addition, an external signal or voltage may be provided to the unit pixel regions PX through the second pad terminals 83. Since the pad region PR is provided at the edge portion of the first substrate 100, the second pad terminals 83 may be easily coupled to the outside.

The optical black region OB may be disposed between the pixel array region AR and the pad region PR of the first substrate 100. The optical black region OB may be provided to enclose the pixel array region AR, when viewed in a plan view. The optical black region OB may include a plurality of dummy regions 111. A signal generated in the dummy region 111 may be used as information for removing process noises, in a subsequent step.

Hereinafter, the pixel array region AR of the image sensor will be described in more detail with reference to FIGS. 5 and 6.

Figure 5:
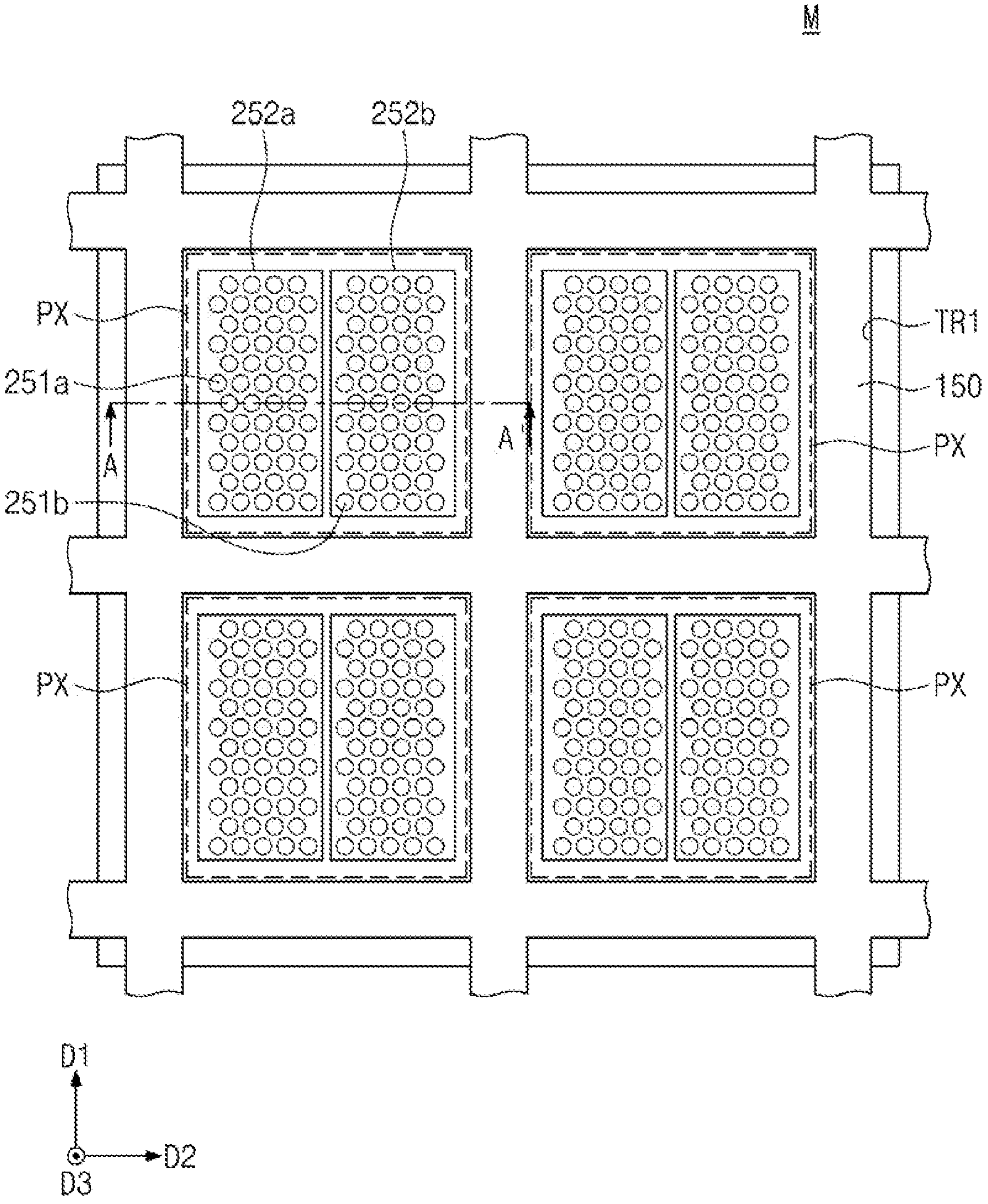
FIG. 5 is an enlarged plan view illustrating a region M of FIG. 3.

FIG. 5 is an enlarged plan view illustrating a region M of FIG. 3. FIG. 6 is a sectional view taken along a line A-A' of FIG. 5.

Figure 6:
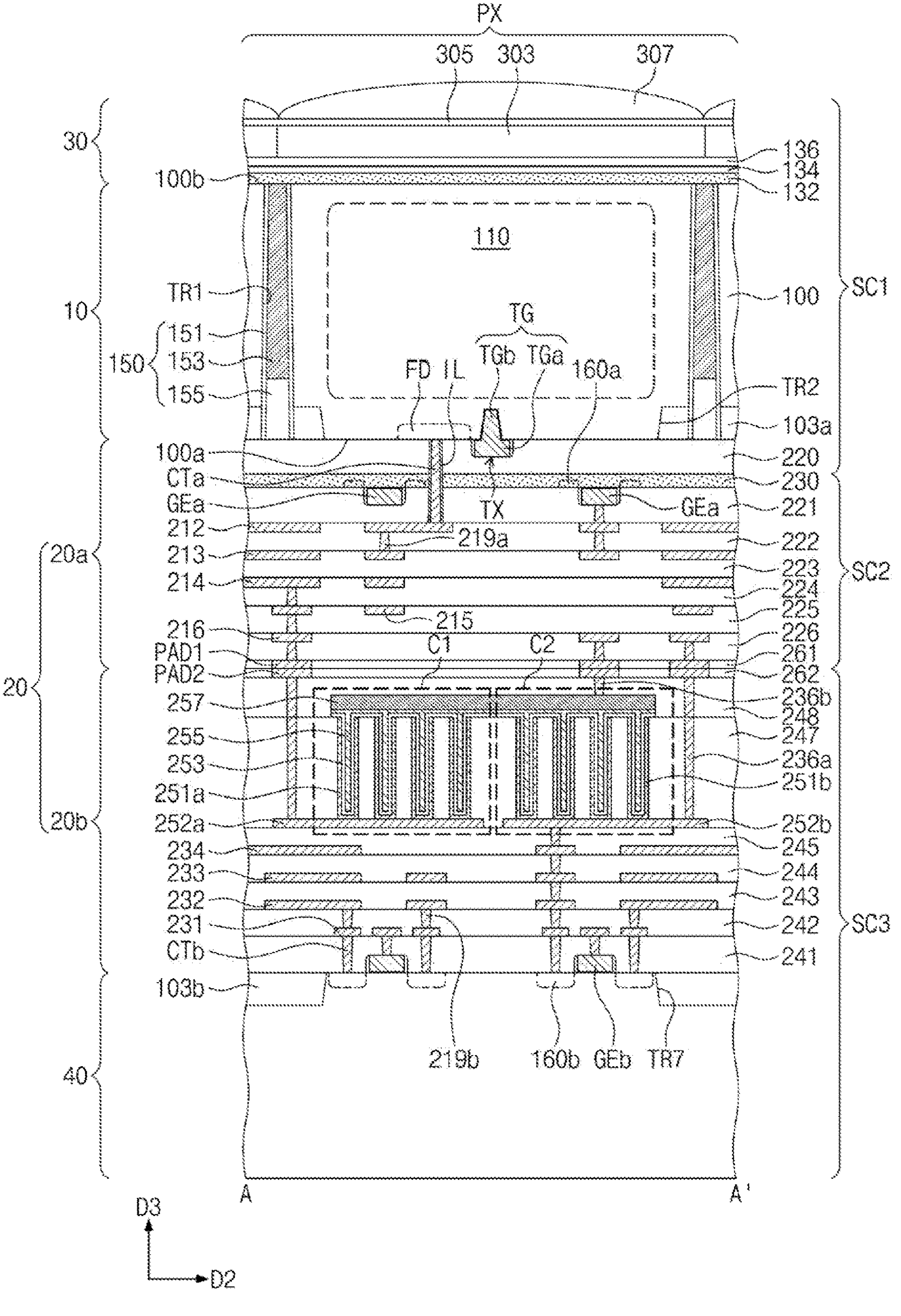
FIG. 6 is a sectional view taken along a line A-A' of FIG. 5.

Referring to FIGS. 5 and 6, the image sensor may include a third semiconductor chip SC3, a second semiconductor chip SC2, and a first semiconductor chip SC1, which are sequentially stacked in the third direction D3. The first semiconductor chip SC1, the second semiconductor chip SC2, and the third semiconductor chip SC3 may be referred to as an upper semiconductor chip, an intermediate semiconductor chip, and a lower semiconductor chip, respectively.

The first semiconductor chip SC1 may include the photoelectric conversion layer 10, the transfer transistor TX, the optically-transparent layer 30, and an upper interlayer insulating layer 220. The photoelectric conversion layer 10 may include the first substrate 100, the pixel isolation pattern 150, and a first device isolation pattern 103*a*.

The first substrate 100 may have a first surface 100*a* and a second surface 100*b*, which are opposite to each other. In the image sensor, light may be incident into the first substrate 100 through the second surface 100*b*. The upper interlayer insulating layer 220 may be disposed on the first surface 100*a* of the first substrate 100, and the optically-transparent layer 30 may be disposed on the second surface 100*b* of the first substrate 100. The first substrate 100 may be a semiconductor substrate or a silicon-on-insulator (SOI) substrate. The semiconductor substrate may include, for example, a silicon substrate, a germanium substrate, or a silicon-germanium substrate. The first substrate 100 may include impurities of a first conductivity type. For example, the impurities of the first conductivity type may include p-type impurities, such as aluminum (Al), boron (B), indium (In) and/or gallium (Ga).

The first substrate 100 may include the unit pixel regions PX defined by the pixel isolation pattern 150. The unit pixel regions PX may be arranged in two different directions (e.g., the first and second directions D1 and D2) to form a matrix-shaped arrangement. The first substrate 100 may include the photoelectric conversion regions 110. The photoelectric conversion regions 110 may be respectively provided in the unit pixel regions PX of the first substrate 100. Each of the photoelectric conversion regions 110 may be a region of the first substrate 100 that is doped with impurities of the second conductivity type. The second conductivity type may be different from the first conductivity type. The impurities of the second conductivity type may include n-type impurities (e.g., phosphorus, arsenic, bismuth, and/or antimony). Each of the photoelectric conversion regions 110 may include a first region adjacent to the first surface 100*a* and a second region adjacent to the second surface 100*b*. There may be a difference in impurity concentration between the first and second regions of the photoelectric conversion region 110. In this case, the photoelectric conversion region 110 may have a non-vanishing potential gradient between the first and second surfaces 100*a* and 100*b* of the first substrate 100. Alternatively, the photoelectric conversion region 110 may be provided to have no potential gradient between the first and second surfaces 100*a* and 100*b* of the first substrate 100.

The first substrate 100 and the photoelectric conversion region 110 may constitute a photodiode. For example, the first substrate 100 of the first conductivity type and the photoelectric conversion region 110 of the second conductivity type may form a pn junction serving as the photodiode. An amount of photocharges, which are generated and accumulated in the photoelectric conversion region 110 of the photodiode, may be proportional to an intensity of an incident light. The photodiode may be configured to have the same function and role as the photoelectric conversion part PD of FIG. 2.

The pixel isolation pattern 150 may be provided in the first substrate 100 to define the unit pixel regions PX. For example, the pixel isolation pattern 150 may be provided between the unit pixel regions PX of the first substrate 100. When viewed in a plan view, the pixel isolation pattern 150 may have a mesh or lattice structure. When viewed in a plan view, the pixel isolation pattern 150 may be provided to completely enclose each of the unit pixel regions PX. The pixel isolation pattern 150 may be provided in a first trench TR1. The first trench TR1 may be an empty region, which is formed by recessing the first surface 100*a* of the first substrate 100. The pixel isolation pattern 150 may be extended from the first surface 100*a* of the first substrate 100 toward the second surface 100*b*. The pixel isolation pattern 150 may be a deep trench isolation (DTI) layer. The pixel isolation pattern 150 may be provided to penetrate the first substrate 100. A vertical height of the pixel isolation pattern 150 may be substantially equal to a vertical thickness of the first substrate 100. A width of the pixel isolation pattern 150 may gradually decrease in a direction from the first surface 100*a* of the first substrate 100 toward the second surface 100*b*.

The pixel isolation pattern 150 may include a first isolation pattern 151, a second isolation pattern 153, and a capping pattern 155. The first isolation pattern 151 may be provided along a side surface of the first trench TR1. In an example embodiment, the first isolation pattern 151 may be formed of or include at least one of silicon-based insulating materials (e.g., silicon nitride, silicon oxide, and/or silicon oxynitride) and/or high-k dielectric materials (e.g., hafnium oxide and/or aluminum oxide). In another example embodiment, the first isolation pattern 151 may include a plurality of layers, which are respectively formed of different materials. The first isolation pattern 151 may have a refractive index lower than that of the first substrate 100. In this case, it may be possible to prevent or suppress a cross-talk phenomenon between the unit pixel regions PX of the first substrate 100.

The second isolation pattern 153 may be provided in the first isolation pattern 151. For example, a side surface of the second isolation pattern 153 may be surrounded by the first isolation pattern 151. The first isolation pattern 151 may be interposed between the second isolation pattern 153 and the first substrate 100. The second isolation pattern 153 may be spaced apart from the first substrate 100 by the first isolation pattern 151. Thus, during an operation of the image sensor, the second isolation pattern 153 may be electrically separated from the first substrate 100. The second isolation pattern 153 may be formed of or include a crystalline semiconductor material (e.g., poly-crystalline silicon). In an example embodiment, the second isolation pattern 153 may further contain dopants of the first or second conductivity type. For example, the second isolation pattern 153 may be formed of or include doped poly silicon. In another example embodiment, the second isolation pattern 153 may be formed of or include an undoped crystalline semiconductor material. For example, the second isolation pattern 153 may be formed of or include undoped poly silicon. Here, the term "undoped" may mean that dopants are not intentionally introduced or a doping process is intentionally omitted. The dopants may include n-type dopants and p-type dopants.

The capping pattern 155 may be provided on a bottom surface of the second isolation pattern 153. The capping pattern 155 may be disposed adjacent to the first surface 100*a* of the first substrate 100. A bottom surface of the capping pattern 155 may be coplanar with the first surface 100*a* of the first substrate 100. The capping pattern 155 may include a non-conductive material. As an example, the capping pattern 155 may be formed of or include at least one of silicon-based insulating materials (e.g., silicon nitride, silicon oxide, and/or silicon oxynitride) and/or high-k dielectric materials (e.g., hafnium oxide and/or aluminum oxide). Accordingly, the pixel isolation pattern 150 may prevent photocharges, which are generated by light incident into each of the unit pixel regions PX, from being supplied into neighboring unit pixel regions PX through a random drift process. In other words, the pixel isolation pattern 150 may prevent a cross-talk phenomenon between the unit pixel regions PX.

The first device isolation pattern 103*a* may be provided in the first substrate 100. For example, the first device isolation pattern 103*a* may be provided in a second trench TR2. The second trench TR2 may be an empty region, which is formed by recessing the first surface 100*a* of the first substrate 100. The first device isolation pattern 103*a* may be a shallow trench isolation (STI) layer. A top surface of the first device isolation pattern 103*a* may be provided in the first substrate 100. A width of the first device isolation pattern 103*a* may gradually decrease in a direction from the first surface 100*a* of the first substrate 100 toward the second surface 100*b*. A top surface of the first device isolation pattern 103*a* may be vertically separated from the photoelectric conversion regions 110. The pixel isolation pattern 150 may be overlapped with a portion of the first device isolation pattern 103*a*. At least a portion of the first device isolation pattern 103*a* may be disposed on a side surface of the pixel isolation pattern 150 and may be in contact with the side surface of the pixel isolation pattern 150. The side and top surfaces of the first device isolation pattern 103*a* and the side surface of the pixel isolation pattern 150 may be provided to form a stepwise structure. The pixel isolation pattern 150 may be provided to penetrate the first device isolation pattern 103*a*. A depth of the first device isolation pattern 103*a* may be smaller than a depth of the pixel isolation pattern 150. The first device isolation pattern 103*a* may include at least one of silicon-based insulating materials. As an example, the first device isolation pattern 103*a* may be formed of or include at least one of silicon nitride, silicon oxide, and/or silicon oxynitride. As another example, the first device isolation pattern 103*a* may include a plurality of layers, which are respectively formed of different materials.

The transfer transistor TX described with reference to FIG. 2 may be provided on the first surface 100*a* of the first substrate 100. The transfer transistor TX may be electrically connected to the photoelectric conversion region 110. The transfer transistor TX may include a transfer gate TG and may be formed with the floating diffusion region FD. The transfer gate TG may include a first portion TGa, which is provided on the first surface 100*a* of the first substrate 100, and a second portion TGb, which is extended from the first portion TGa into the first substrate 100. The largest width of the first portion TGa in the second direction D2 may be larger than the largest width of the second portion TGb in the second direction D2. A gate dielectric layer may be interposed between the transfer gate TG and the first substrate 100. The floating diffusion region FD may be provided near a side of the transfer gate TG. A gate spacer may be provided on a side surface of the first portion TGa of the transfer gate TG. The floating diffusion region FD may have a second conductivity type (e.g., n-type) that is different from that of the first substrate 100.

The upper interlayer insulating layer 220 may be disposed on the first surface 100*a* of the first substrate 100. The upper interlayer insulating layer 220 may cover the transfer gate TG. The upper interlayer insulating layer 220 may be interposed between the first substrate 100 and an intermediate substrate 230, which will be described below. The upper interlayer insulating layer 220 may be formed of or include at least one of silicon-based insulating materials (e.g., silicon oxide, silicon nitride, and/or silicon oxynitride).

The optically-transparent layer 30 may include color filters 303 and micro lenses 307. The optically-transparent layer 30 may be configured to collect and filter light, which is incident from the outside, and then to provide the light to the photoelectric conversion layer 10.

In detail, the color filters 303 and the micro lenses 307 may be provided on the second surface 100*b* of the first substrate 100. The color filters 303 may be disposed on the unit pixel regions PX, respectively. The micro lenses 307 may be disposed on the color filters 303, respectively. A (negative) fixed charge layer 132 may be disposed between the second surface 100*b* of the first substrate 100 and the color filters 303. The fixed charge layer 132 may be in contact with the second surface 100*b* of the first substrate 100. In an example embodiment, the fixed charge layer 132 may be formed of or include at least one of metal oxide materials (e.g., hafnium oxide and aluminum oxide). First and second insulating layers 134 and 136 may be disposed between the fixed charge layer 132 and the color filters 303. At least one of the first and second insulating layers 134 and 136 may serve as an anti-reflection layer. The anti-reflection layer may be configured to prevent light, which is incident through the second surface 100*b* of the first substrate 100, from being reflected, thereby allowing the light to be effectively incident into the photoelectric conversion regions 110. One of the first and second insulating layers 134 and 136 may be formed of or include silicon oxide or silicon nitride. A third insulating layer 305 may be disposed between the color filters 303 and the micro lenses 307.

The color filters 303 may include primary color filters. The color filters 303 may include first to third color filters having different colors from each other. As an example, the first to third color filters may be or include green, red, and blue filters, respectively. The first to third color filters may be arranged to form a Bayer pattern. In another example embodiment, the first to third color filters may be provided to have other colors, such as cyan, magenta, or yellow.

The micro lenses 307 may have a convex shape, and in this case, it may be possible to more effectively condense light, which is incident into the unit pixel regions PX. When viewed in a plan view, the micro lenses 307 may be overlapped with the photoelectric conversion regions 110, respectively.

The second semiconductor chip SC2 may be disposed below the first semiconductor chip SC1. The second semiconductor chip SC2 may include the intermediate substrate 230 adjacent to the upper interlayer insulating layer 220, upper insulating layers 221-226 on a bottom surface of the intermediate substrate 230, and upper interconnection patterns 212-216 in the upper insulating layers 221-226. The upper insulating layers 221-226 and the upper interconnection patterns 212-216 may constitute an upper interconnection layer 20*a*, which is provided below the photoelectric conversion layer 10.

The intermediate substrate 230 may be disposed on a bottom surface of the upper interlayer insulating layer 220. The intermediate substrate 230 may be a silicon substrate that is formed of or includes silicon. Alternatively, the intermediate substrate 230 may be a substrate that is formed of or includes at least one of silicon germanium, silicon carbide, or organic semiconductor materials. First gate electrodes GEa may be disposed on the bottom surface of the intermediate substrate 230. First impurity regions 160*a* may be formed in the intermediate substrate 230. The first impurity regions 160*a* may be formed near the bottom surface of the intermediate substrate 230. One of the first gate electrodes GEa and the first impurity regions 160*a* may constitute one of the reset transistor RX, the dual conversion transistor DCX, and the first source follower transistor SF1 described with reference to FIG. 2.

The upper insulating layers 221-226 may be sequentially provided on the bottom surface of the intermediate substrate 230. The upper insulating layers 221-226 may include a first upper insulating layer 221, a second upper insulating layer 222, a third upper insulating layer 223, a fourth upper insulating layer 224, a fifth upper insulating layer 225, and a sixth upper insulating layer 226. The number of the upper insulating layers 221-226 is not limited to that in the illustrated example and may be variously changed. The first upper insulating layer 221 may cover the first gate electrodes GEa. Each of the first to sixth upper insulating layers 221-226 may be formed of or include at least one of silicon-based insulating materials (e.g., silicon oxide, silicon nitride, and/or silicon oxynitride). In an example embodiment, the second semiconductor chip SC2 may be a silicon-on-insulator (SOI) substrate.

The upper interconnection patterns 212-216 may be disposed in the upper insulating layers 221-226. The upper interconnection patterns 212-216 may include a first upper interconnection pattern 212, a second upper interconnection pattern 213, a third upper interconnection pattern 214, a fourth upper interconnection pattern 215, and a fifth upper interconnection pattern 216. The first upper interconnection patterns 212 may be disposed in the second upper insulating layer 222. The second upper interconnection patterns 213 may be disposed in the third upper insulating layer 223. The third upper interconnection patterns 214 may be disposed in the fourth upper insulating layer 224. The fourth upper interconnection patterns 215 may be disposed in the fifth upper insulating layer 225. The fifth upper interconnection patterns 216 may be disposed in the sixth upper insulating layer 226. First vias 219*a* may be provided in the upper insulating layers 221-226. The first vias 219*a* may connect adjacent ones of the upper interconnection patterns 212-216 to each other.

The upper interconnection layer 20*a* may further include an upper pad insulating layer 261, which is provided below the sixth upper insulating layer 226, and first conductive pads PAD1, which are provided in the upper pad insulating layer 261. The first conductive pads PAD1 may be disposed near a lower interconnection layer 20*b*, which will be described below. The first conductive pads PAD1 may be provided to electrically connect the upper interconnection layer 20*a* to the lower interconnection layer 20*b*. One of the first vias 219*a* may connect the first conductive pad PAD1 to the fifth upper interconnection pattern 216.

The upper interconnection layer 20*a* may further include contact patterns CTa. Each of the contact patterns CTa may be provided to connect the floating diffusion region FD or one of the first gate electrodes GEa to one of the first upper interconnection patterns 212. The contact pattern CTa, which is electrically connected to the floating diffusion region FD, may be provided to penetrate the first upper insulating layer 221, the intermediate substrate 230, and the upper interlayer insulating layer 220 and to be in contact with the floating diffusion region FD. A side surface of the contact pattern CTa, which is electrically connected to the floating diffusion region FD, may be covered with an insulating pattern IL. One of the first gate electrodes GEa may be electrically connected to the floating diffusion region FD through the contact pattern CTa.

Each of the first to fifth upper interconnection patterns 212-216, the first vias 219*a*, the first conductive pads PAD1, and the contact patterns CTa may be formed of or include at least one of conductive metal materials. As an example, at least one or each of the first to fifth upper interconnection patterns 212-216, the first vias 219*a*, the first conductive pads PAD1, and the contact patterns CTa may be formed of or include copper.

The third semiconductor chip SC3 may be disposed below the second semiconductor chip SC2. The third semiconductor chip SC3 may include a second substrate 40, a lower interconnection layer 20*b*, and capacitors C1 and C2.

The second substrate 40 may be a semiconductor substrate or a silicon-on-insulator (SOI) substrate. The semiconductor substrate may include, for example, a silicon substrate, a germanium substrate, or a silicon-germanium substrate.

A second device isolation pattern 103*b* may be provided in the second substrate 40. For example, the second device isolation pattern 103*b* may be provided in a seventh trench TR7, which is recessed from a top surface of the second substrate 40. In an example embodiment, the second device isolation pattern 103*b* may have substantially the same structure as the first device isolation pattern 103*a*.

Second impurity regions 160*b* may be provided in the second substrate 40 near the top surface of the second substrate 40. Second gate electrodes GEb may be disposed on the top surface of the second substrate 40. One of the second gate electrodes GEb and the second impurity region 160*b* may constitute one of the sampling transistor SAM, the pre-charging transistor PC, the calibration transistor Cal, the selection transistor SEL, and the second source follower transistor SF2 described with reference to FIG. 2. The second gate electrode GEb may be electrically connected to one of first and second capacitors C1 and C2, which will be described below.

The lower interconnection layer 20*b* may be provided on the top surface of the second substrate 40. The lower interconnection layer 20*b* may be interposed between the upper interconnection layer 20*a* and the second substrate 40. The lower interconnection layer 20*b* may include lower insulating layers 241-245 and lower interconnection patterns 231-234.

The lower insulating layers 241-245 may be sequentially provided on the top surface of the second substrate 40. The lower insulating layers 241-245 may include a first lower insulating layer 241, a second lower insulating layer 242, a third lower insulating layer 243, a fourth lower insulating layer 244, and a fifth lower insulating layer 245. The number of the lower insulating layers 241-245 is not limited to that in the illustrated example and may be variously changed. The first lower insulating layer 241 may cover the second gate electrodes GEb. Each of the first to fifth lower insulating layers 241-245 may be formed of or include at least one of silicon-based insulating materials (e.g., silicon oxide, silicon nitride, and/or silicon oxynitride).

The lower interconnection patterns 231-234 may be disposed in the lower insulating layers 241-245. The lower interconnection patterns 231-234 may include a first lower interconnection pattern 231, a second lower interconnection pattern 232, a third lower interconnection pattern 233, and a fourth lower interconnection pattern 234. The first lower interconnection patterns 231 may be disposed in the second lower insulating layer 242. The second lower interconnection patterns 232 may be disposed in the third lower insulating layer 243. The third lower interconnection patterns 233 may be disposed in the fourth lower insulating layer 244. The fourth lower interconnection patterns 234 may be disposed in the fifth lower insulating layer 245. Second vias 219*b* may be provided in the lower insulating layers 241-245. The second vias 219*b* may connect adjacent ones of the lower interconnection patterns 231-234 to each other.

The lower interconnection layer 20*b* may further include lower contact patterns CTb. Each of the lower contact patterns CTb may be provided to connect the second impurity region 160*b* or one of the second gate electrodes GEb to one of the first lower interconnection patterns 231.

Each of the first to fourth lower interconnection patterns 231-234, the second vias 219*b*, and the lower contact patterns CTb may be formed at least one of conductive metal materials. As an example, at least one or each of the first to fourth lower interconnection patterns 231-234, the second vias 219*b*, and the lower contact patterns CTb may be formed of or include copper.

First and second lower pad electrodes 252*a* and 252*b* may be disposed on the fifth lower insulating layer 245. The first and second lower pad electrodes 252*a* and 252*b* may be disposed to be spaced apart from each other. Each of the first and second lower pad electrodes 252*a* and 252*b* may be provided in the form of a plate. The first and second lower pad electrodes 252*a* and 252*b* may be overlapped with the photoelectric conversion region 110, when viewed in a plan view.

The first and second lower pad electrodes 252*a* and 252*b* may be formed of or include at least one of metallic materials (e.g., tungsten, titanium, and tantalum) and/or conductive metal nitride materials (e.g., titanium nitride, tantalum nitride, and tungsten nitride).

The first and second lower pad electrodes 252*a* and 252*b* provided in the form of a plate may reflect light, which is incident through the first substrate 100, toward the photoelectric conversion region 110, and thus, a fraction of the light may be re-entered into the photoelectric conversion region 110.

The lower interconnection layer **20*b* may further include a mold insulating layer 247 on the fifth lower insulating layer 245, and a lower interlayer insulating layer 248 on the mold insulating layer 247. In an example embodiment, the mold insulating layer 247 and the lower interlayer insulating layer 248** may be formed of or include at least one of silicon-based insulating materials (e.g., silicon nitride, silicon oxide, and/or silicon oxynitride).

The mold insulating layer 247 may cover the first and second lower pad electrodes **252*a* and 252*b*. The mold insulating layer 247 may have a plurality of openings exposing the first and second lower pad electrodes 252*a* and 252*b*. First bottom electrodes 251*a* and second bottom electrodes 251*b* may be disposed in the openings. The first bottom electrodes 251*a* may be disposed on the first lower pad electrode 252*a* to be spaced apart from each other. The second bottom electrodes 251*b* may be disposed on the second lower pad electrode 252*b*** to be spaced apart from each other.

The first bottom electrodes **251*a* may be arranged on the first lower pad electrode 252*a* in the first and second directions D1 and D2, and adjacent ones of the first bottom electrodes 251*a* may be arranged in an alternate manner. In other words, the first bottom electrodes 251*a* may be arranged in a zigzag or honeycomb shape (e.g., see FIG. 5**).

Similar to the first bottom electrodes **251*a*, the second bottom electrodes 251*b* may be arranged in a zigzag or honeycomb shape, on the second lower pad electrode 252*b*. Since the first and second bottom electrodes 251*a* and 251*b* are arranged in the zigzag or honeycomb shape, an integration density of the first and second bottom electrodes 251*a* and 251*b* may be increased. In an example embodiment, each of the first and second bottom electrodes 251*a* and 251*b* may be provided to conformally cover an inner surface of the opening or to have a cylinder shape. Top surfaces of the first and second bottom electrodes 251*a* and 251*b* may be located at substantially the same level as a top surface of the mold insulating layer 247**.

A dielectric layer 253 and a top electrode 255 may be sequentially disposed on the mold insulating layer 247 to conformally cover the first and second bottom electrodes **251*a* and 251*b*. The dielectric layer 253 may be formed to cover inner surfaces of the first and second bottom electrodes 251*a* and 251*b* at a uniform thickness. The top electrode 255 may be provided on the dielectric layer 253 to cover the first and second bottom electrodes 251*a* and 251*b***.

The first and second bottom electrodes **251*a* and 251*b* and the top electrode 255** may be formed of or include at least one of high melting point metals (e.g., cobalt, titanium, nickel, tungsten, and molybdenum) and/or metal nitride materials (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN)).

The dielectric layer 253 may be formed of or include at least one of metal oxides (e.g., $HfO_2$, $ZrO_2$, $Al_2O_3$, $La_2O_3$, $Ta_2O_3$, and $TiO_2$) and/or perovskite dielectric materials (e.g., $SrTiO_3$ (STO), $(Ba,Sr)TiO_3$ (BST), $BaTiO_3$, PZT, and PLZT), and may have a single- or multi-layered structure.

An upper pad electrode 257 may be disposed on the top electrode 255. The upper pad electrode 257 may be formed of or include a conductive material, which is different from the top electrode 255, or a doped semiconductor material. For example, the upper pad electrode 257 may be formed of or include at least one of doped polysilicon, silicon germanium, and/or metallic materials (e.g., tungsten, copper, aluminum, titanium, and tantalum).

The upper pad electrode 257 may be vertically overlapped with the first and second lower pad electrodes **252*a* and 252*b*, when viewed in a plan view. A thickness of the upper pad electrode 257 may be larger than thicknesses of the first and second lower pad electrodes 252*a* and 252*b***.

The upper pad electrode 257, the first lower pad electrode **252*a*, the first bottom electrodes 251*a*, the dielectric layer 253, and the top electrode 255 may constitute the first capacitor C1 described with reference to FIG. 2. In addition, the upper pad electrode 257, the second lower pad electrode 252*b*, the second bottom electrodes 251*b*, the dielectric layer 253, and the top electrode 255 may constitute the second capacitor C2 described with reference to FIG. 2. The first and second capacitors C1 and C2 may be configured to share the dielectric layer 253, the top electrode 255, and the upper pad electrode 257. The first and second capacitors C1 and C2 may be disposed in the mold insulating layer 247. The first and second capacitors C1 and C2 may be vertically overlapped with the photoelectric conversion region 110**.

Due to their cylindrical shape, each of the first and second bottom electrodes **251*a* and 251*b* may have an increased surface area. Furthermore, since the first and second bottom electrodes 251*a* and 251*b* are arranged in the zigzag shape, the number of the first and second bottom electrodes 251*a* and 251*b*, which are placed on the first and second lower pad electrodes 252*a* and 252*b*, may be increased. This may make it possible to increase electrostatic capacitances of the first and second capacitors C1 and C2**. As a result, it may be possible to reduce loss of electric charges and occurrence of a noise signal during the global shutter operation and thereby to improve efficiency in the shutter operation.

The lower interlayer insulating layer 248 may be provided on the mold insulating layer 247 to cover the first and second capacitors C1 and C2. For example, the lower interlayer insulating layer 248 may cover the upper pad electrode 257, a side surface of the top electrode 255, and a side surface of the dielectric layer 253.

The lower interconnection layer **20*b* may further include a lower pad insulating layer 262 on the lower interlayer insulating layer 248 and second conductive pads PAD2 in the lower pad insulating layer 262. The second conductive pads PAD2 may be provided near the upper interconnection layer 20*a*. The second conductive pads PAD2 may be formed of or include at least one of conductive metal materials (e.g., copper). The second conductive pads PAD2 may electrically connect the lower interconnection layer 20*b* to the upper interconnection layer 20*a*. The first and second conductive pads PAD1 and PAD2 may be in contact with each other. The upper interconnection layer 20*a* and the lower interconnection layer 20*b* may constitute the interconnection layer 20. The first and second capacitors C1 and C2 may be located at a level lower than the second conductive pads PAD2. The first and second capacitors C1 and C2 may be closer to the second substrate 40 than the first or second conductive pad PAD1 or PAD2** is.

A first connection pattern **236*a* may be provided to penetrate the lower interlayer insulating layer 248 and the mold insulating layer 247, and to be connected to the first or second lower pad electrode 252*a* or 252*b*. The first connection pattern 236*a* may be provided to connect the second conductive pad PAD2 to the first or second lower pad electrode 252*a* or 252*b***.

A second connection pattern **236*b* may be provided to penetrate the lower interlayer insulating layer 248 and to be connected to the upper pad electrode 257. The second connection pattern 236*b* may be provided to connect the second conductive pad PAD2 to the upper pad electrode 257**.

In the case where the capacitors C1 and C2 are formed in the second semiconductor chip SC2, a process of forming the contact pattern CTa connected to the floating diffusion region FD may be performed and then a process of forming the capacitors C1 and C2 may be performed. In this case, titanium atoms, which are included in a barrier layer of the contact pattern CTa, may be diffused into the photoelectric conversion region 110, because the process of forming the capacitors C1 and C2 includes a high-temperature step that is performed at temperature of 500° C. or higher, and in this case, a white spot issue may occur. In the case where the contact pattern CTa is formed after forming the capacitors C1 and C2 in the second semiconductor chip SC2, a conversion gain property of the image sensor may be deteriorated, because a length of the contact pattern CTa is increased. That is, if the capacitors C1 and C2 are formed in the second semiconductor chip SC2, optical characteristics of the image sensor may be deteriorated.

In contrast, according to an example embodiment, the capacitors C1 and C2 may be formed in the third semiconductor chip SC3, e.g., the capacitors C1 and C2 may be formed in the third semiconductor chip SC3 through a process that is distinct from a process of forming the first and second semiconductor chips SC1 and SC2. Accordingly, it may be possible to prevent the titanium atoms in the barrier layer of the contact pattern CTa from being diffused into the photoelectric conversion region 110 during a high-temperature process for forming the capacitors C1 and C2 and to reduce a length of the contact pattern CTa. As a result, it may be possible to improve optical characteristics of an image sensor.

Referring back to FIGS. 3 and 4, a first connection structure 50, a first pad terminal 81, and a bulk color filter 90 may be provided on the optical black region OB of the first substrate 100. The first connection structure 50 may include a first light-blocking pattern 51, a first insulating pattern 53, and a first capping pattern 55. The first light-blocking pattern 51 may be provided on the second surface 100*b* of the first substrate 100. The first light-blocking pattern 51 may cover the second insulating layer 136 on the second surface 100*b*, and may conformally cover inner surfaces of third and fourth trenches TR3 and TR4. The first light-blocking pattern 51 may be provided to penetrate the photoelectric conversion layer 10 and a portion of the interconnection layer 20, and to electrically connect the photoelectric conversion layer 10 to the interconnection layer 20. For example, the first light-blocking pattern 51 may be in contact with interconnection lines in the interconnection layer 20 and the pixel isolation pattern 150 in the photoelectric conversion layer 10. Accordingly, the first connection structure 50 may be electrically connected to the interconnection lines in the interconnection layer 20. The first light-blocking pattern 51 may also prevent light from being incident into the optical black region OB.

The first pad terminal 81 may be provided in the third trench TR3 to fill a remaining space of the third trench TR3. The first pad terminal 81 may be formed of or include a metallic material (e.g., aluminum). The first pad terminal 81 may be connected to the pixel isolation pattern 150 (in particular, the second isolation pattern 153). Thus, a negative voltage may be applied to the pixel isolation pattern 150 through the first pad terminal 81.

The first insulating pattern 53 may be provided on the first light-blocking pattern 51 to fill a remaining space of the fourth trench TR4. The first insulating pattern 53 may be provided to penetrate the photoelectric conversion layer 10 and a portion of the interconnection layer 20. The first capping pattern 55 may be provided on the first insulating pattern 53. The first capping pattern 55 may be provided on the first insulating pattern 53. The first capping pattern 55 may be formed of or include the same material as the capping pattern 155.

The bulk color filter 90 may be provided on the first pad terminal 81, the first light-blocking pattern 51, and the first capping pattern 55. The bulk color filter 90 may cover the first pad terminal 81, the first light-blocking pattern 51, and the first capping pattern 55. A first protection layer 71 may be provided on the bulk color filter 90 to cover the bulk color filter 90.

A photoelectric conversion region 110' and the dummy region 111 may be provided in the optical black region OB of the first substrate 100. The photoelectric conversion region 110' may be doped to have a second conductivity type (e.g., an n-type) that is different from the first conductivity type. The photoelectric conversion region 110' may have a structure similar to the photoelectric conversion region 110 described with reference to FIG. 6, but may not be used to convert light to an electrical signal. The dummy region 111 may be an undoped region. A signal generated in the photoelectric conversion region 110' and the dummy region 111 may be used as information for removing a process noise.

A second connection structure 60, a second pad terminal 83, and a second protection layer 73 may be provided on the pad region PR of the first substrate 100. The second connection structure 60 may include a second light-blocking pattern 61, a second insulating pattern 63, and a second capping pattern 65.

The second light-blocking pattern 61 may be provided on the second surface 100*b* of the first substrate 100. In detail, the second light-blocking pattern 61 may be formed to cover the second insulating layer 136 on the second surface 100*b*, and to conformally cover inner surfaces of fifth and sixth trenches TR5 and TR6. The second light-blocking pattern 61 may be provided to penetrate the photoelectric conversion layer 10 and a portion of the interconnection layer 20. In detail, the second light-blocking pattern 61 may be in contact with the interconnection lines in the interconnection layer 20. The second light-blocking pattern 61 may be formed of or include at least one of metallic materials (e.g., tungsten).

The second pad terminal 83 may be provided in the fifth trench TR5. The second pad terminal 83 may be provided on the second light-blocking pattern 61 to fill a remaining portion of the fifth trench TR5. The second pad terminal 83 may be formed of or include a metal material (e.g., aluminum). The second pad terminal 83 may be used as an electric conduction path between the image sensor device and the outside. The second insulating pattern 63 may be formed to fill the remaining space of the sixth trench TR6. The second insulating pattern 63 may be provided to penetrate the photoelectric conversion layer 10 and a portion of the interconnection layer 20. The second capping pattern 65 may be provided on the second insulating pattern 63. The second capping pattern 65 may be formed of or include the same material as the capping pattern 155. The second protection layer 73 may cover a portion of the second light-blocking pattern 61 and the second capping pattern 65.

A current, which is applied through the second pad terminal 83, may be supplied to the pixel isolation pattern 150 through the second light-blocking pattern 61, the interconnection lines in the interconnection layer 20, and the first light-blocking pattern 51. Electrical signals, which are produced in the photoelectric conversion regions 110 and 110' and the dummy region 111, may be transmitted to the outside of the image sensor through the interconnection lines in the interconnection layer 20, the second light-blocking pattern 61, and the second pad terminal 83.

FIGS. 7A to 7F are sectional views illustrating a method of fabricating an image sensor according to an example embodiment.

Figure 7A:
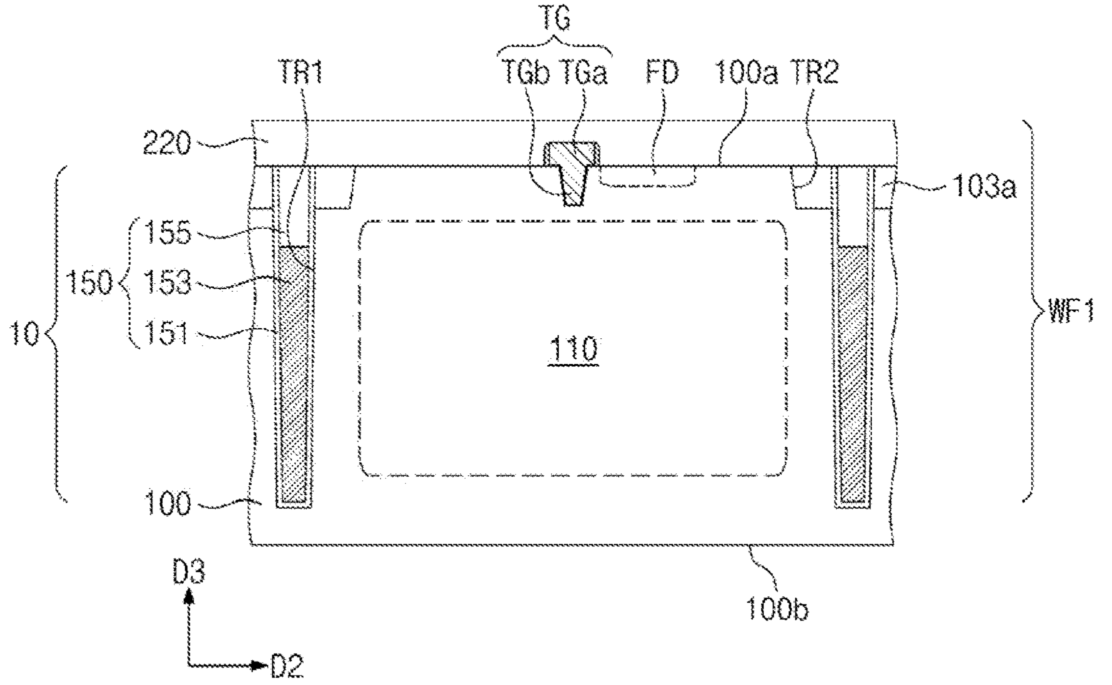
FIGS. 7A to 7F are sectional views illustrating a method of fabricating an image sensor according to an example embodiment.

Referring to FIG. 7A, the first substrate 100 may be prepared, and here, the first substrate 100 may have the first and second surfaces 100*a* and 100*b*, which are opposite to each other. The first substrate 100 may contain impurities of the first conductivity type (e.g., p-type). As an example, the first substrate 100 may be provided to include a bulk silicon wafer (e.g., of the first conductivity type) and an epitaxial layer (e.g., of the first conductivity type) formed on the bulk silicon wafer. As another example, the first substrate 100 may be a bulk substrate including a well region of the first conductivity type.

The second trench TR2 may be formed in the first substrate 100 near the first surface 100*a*. The first device isolation pattern 103*a* may be formed in the second trench TR2. The first trench TR1 may be formed by etching the first device isolation pattern 103*a* and the first substrate 100. The pixel isolation pattern 150 may be formed in the first trench TR1.

The photoelectric conversion regions 110 may be formed by injecting impurities into the first substrate 100. The photoelectric conversion regions 110 may be formed to have a second conductivity type (e.g., n-type), which is different from the first conductivity type (e.g., p-type).

The transfer gate TG may be formed on the first surface 100*a* of the first substrate 100. The transfer gate TG may include the first portion TGa, which is provided on the first surface 100*a* of the first substrate 100, and the second portion TGb, which is extended from the first portion TGa into the first substrate 100.

The floating diffusion region FD may be formed by injecting impurities into the first substrate 100 through the first surface 100*a*. The floating diffusion region FD may be formed to have the second conductivity type (e.g., n-type).

The upper interlayer insulating layer 220 may be formed to cover the transfer gate TG. As a result, a first wafer portion WF1 may be formed. The first wafer portion WF1 may include the photoelectric conversion layer 10 and the upper interlayer insulating layer 220. The first wafer portion WF1 may serve as the first semiconductor chip SC1 in the final structure described with reference to FIG. 6.

Figure 7B:
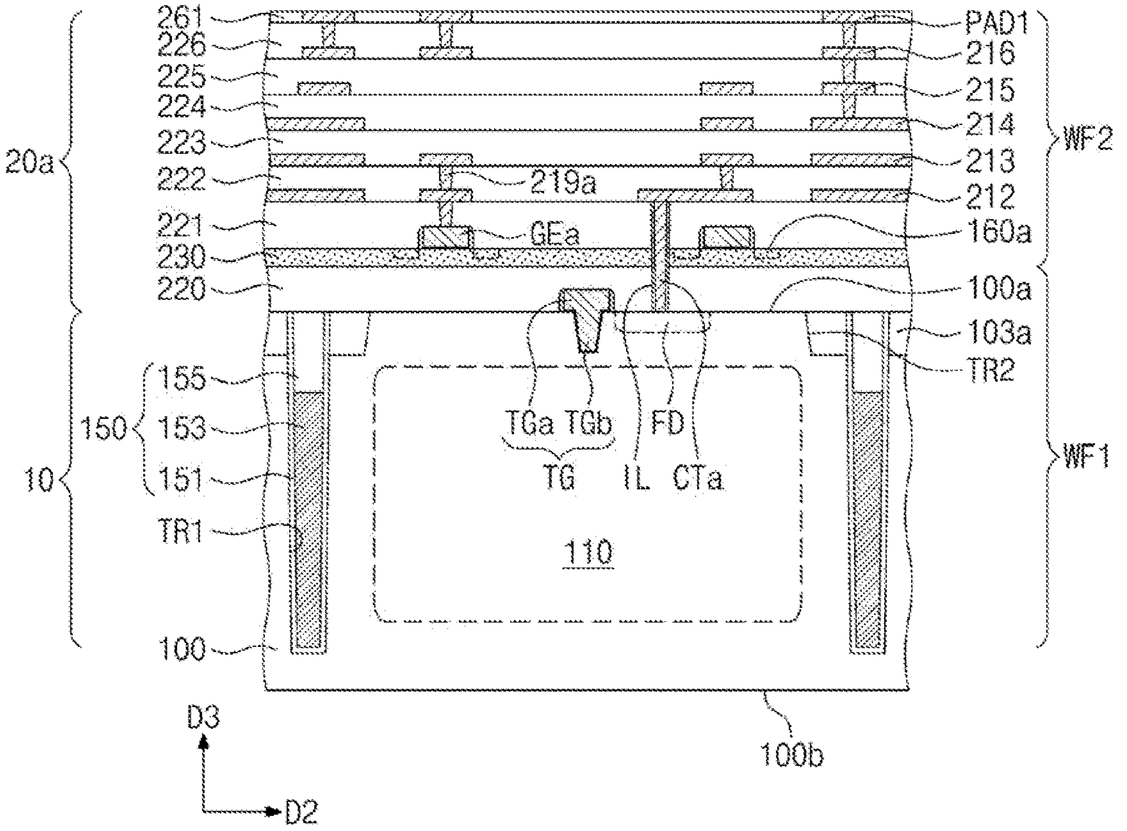

Referring to FIG. 7B, the intermediate substrate 230 may be formed or disposed on the upper interlayer insulating layer 220. The intermediate substrate 230 may be a silicon substrate, which is formed of or includes silicon. Alternatively, the intermediate substrate 230 may be formed of or include at least one of silicon germanium, silicon carbide, or organic semiconductor materials. The first gate electrodes GEa may be formed on a top surface of the intermediate substrate 230. The first impurity region 160*a* may be formed by injecting impurities into the intermediate substrate 230. One of the first gate electrodes GEa and the first impurity regions 160*a* may constitute one of the reset transistor RX, the dual conversion transistor DCX, and the first source follower transistor SF1 described with reference to FIG. 2.

The first upper insulating layer 221 may be formed to cover the first gate electrodes GEa. The contact patterns CTa may be formed to penetrate the first upper insulating layer 221. One of the contact patterns CTa may be connected to the first gate electrode GEa. One of the contact patterns CTa may further penetrate the intermediate substrate 230 and the upper interlayer insulating layer 220, and may be in contact with the floating diffusion region FD. A side surface of the contact pattern CTa penetrating the intermediate substrate 230 may be covered with the insulating pattern IL. Second to sixth upper insulating layers 222-226 may be sequentially formed on the first upper insulating layer 221. The first to fifth upper interconnection patterns 212-216 may be formed in the second to sixth upper insulating layers 222-226, respectively. The first vias 219*a* may be formed in the second to sixth upper insulating layers 222-226 to connect the first to fifth upper interconnection patterns 212-216 to each other. The upper pad insulating layer 261 may be formed on the sixth upper insulating layer 226. The first conductive pads PAD1 may be formed in the upper pad insulating layer 261.

Thus, a second wafer portion WF2 may be formed on the first wafer portion WF1. The second wafer portion WF2 may serve as the second semiconductor chip SC2 in the final structure described with reference to FIG. 6.

Figure 7C:
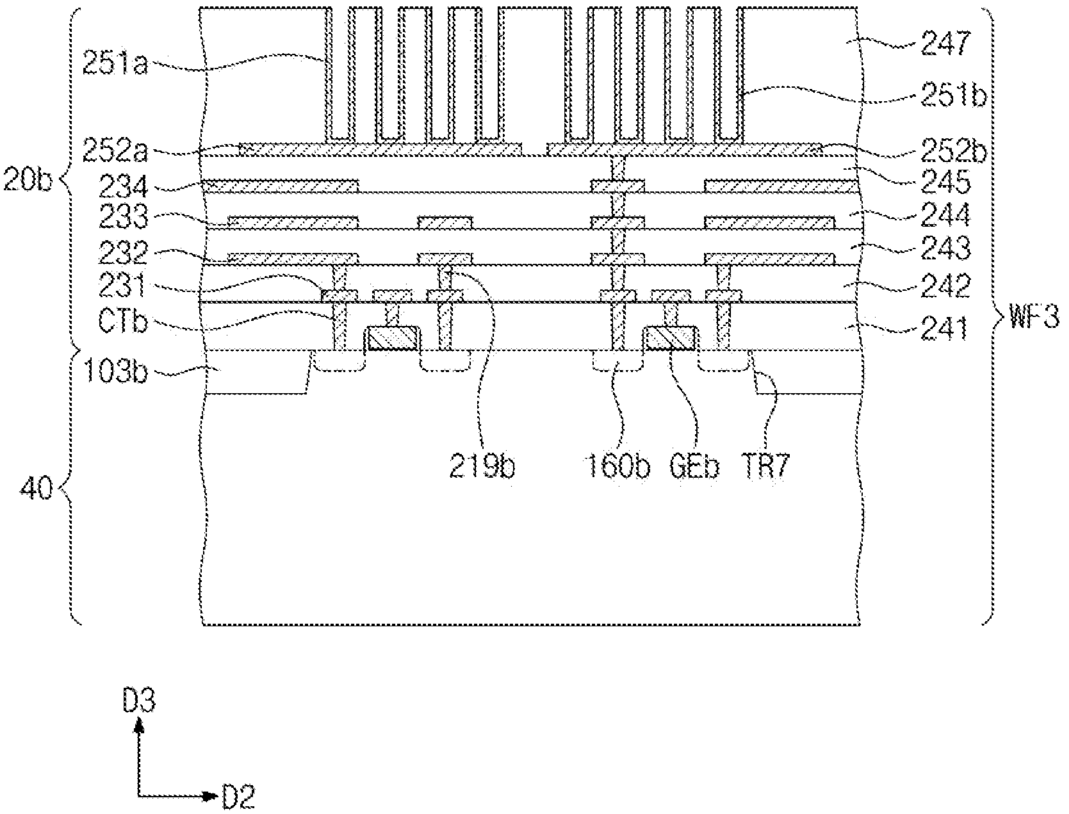

Referring to FIG. 7C, the second substrate 40 may be prepared. The second substrate 40 may be a semiconductor substrate or a silicon-on-insulator (SOI) substrate. The semiconductor substrate may include, for example, a silicon substrate, a germanium substrate, or a silicon-germanium substrate.

The second device isolation pattern 103*b* may be formed near the top surface of the second substrate 40. The second gate electrodes GEb may be formed on the top surface of the second substrate 40. The second impurity regions 160*b* may be formed near the top surface of the second substrate 40. One of the second gate electrodes GEb and the second impurity region 160*b* may constitute one of the sampling transistor SAM, the pre-charging transistor PC, the calibration transistor Cal, the selection transistor SEL, and the second source follower transistor SF2 described with reference to FIG. 2.

The first lower insulating layer 241 may be formed on the top surface of the second substrate 40. The first lower insulating layer 241 may cover the second gate electrodes GEb. The lower contact patterns CTb may be formed to penetrate the first lower insulating layer 241. The lower contact patterns CTb may be connected to the second gate electrode GEb or the second impurity region 160*b*. Second to fifth lower insulating layers 242-245 may be sequentially formed on the first lower insulating layer 241. The first to fourth lower interconnection patterns 231-234 may be formed in the second to fifth lower insulating layers 242-245, respectively. The second vias 219*b* may be formed in the second to fifth lower insulating layers 242-245 to connect the first to fourth lower interconnection patterns 231-234 to each other.

The first lower pad electrode 252*a* and the second lower pad electrode 252*b* may be formed on the fifth lower insulating layer 245 to be spaced apart from each other. The mold insulating layer 247 may be formed to cover the first and second lower pad electrodes 252*a* and 252*b*. Openings may be formed in the mold insulating layer 247 to expose the first and second lower pad electrodes 252*a* and 252*b*. The openings may be arranged in a zigzag or honeycomb shape, in plan view.

A bottom electrode layer (not show) may be deposited to conformally cover the mold insulating layer 247, and then, a planarization process may be performed on bottom electrode layer to form the first and second bottom electrodes 251*a* and 251*b*. The process of depositing the bottom electrode layer may be a high-temperature process, which is performed at temperature of 500° C. or higher. The first bottom electrodes 251*a* may be connected to the first lower pad electrode 252*a*. The second bottom electrodes 251*b* may be connected to the second lower pad electrode 252*b*. Each of the first and second bottom electrodes 251*a* and 251*b* may have a cylinder shape.

Figure 7D:
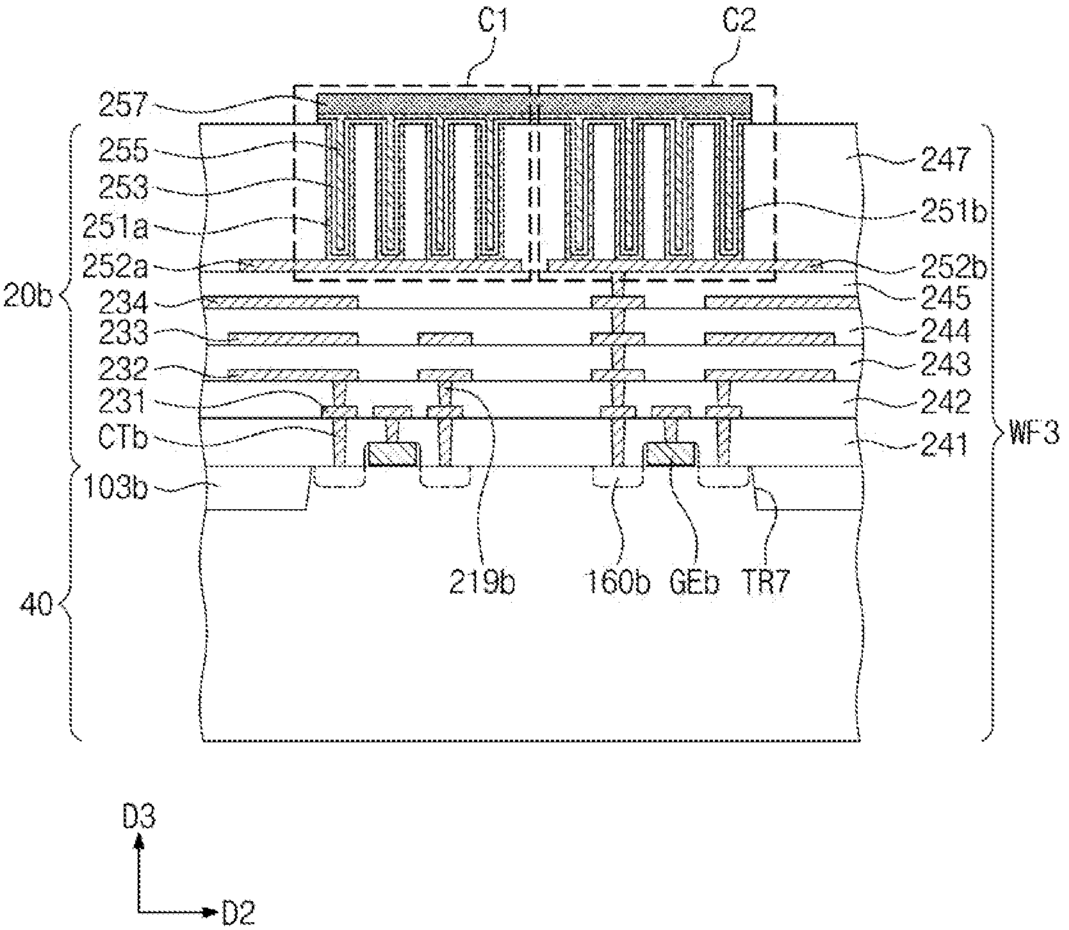

Referring to FIG. 7D, a preliminary dielectric layer (not shown) may be formed on the first and second bottom electrodes 251*a* and 251*b*. A top electrode layer (not shown) may be formed on the preliminary dielectric layer. The preliminary dielectric layer and the top electrode layer may be formed using one of chemical vapor deposition (CVD), physical vapor deposition (PVD), and atomic layer deposition (ALD) processes. The preliminary dielectric layer and the top electrode layer may cover exposed surfaces of the first and second bottom electrodes 251*a* and 251*b*, and may be extended to a region on a top surface of the mold insulating layer 247.

An upper pad electrode layer (not shown) may be formed on the preliminary dielectric layer and the top electrode layer. The upper pad electrode layer may be patterned to form the upper pad electrode 257. The preliminary dielectric layer and the top electrode layer may be etched using the upper pad electrode 257 as an etch mask. Accordingly, the dielectric layer 253 and the top electrode 255 may be formed. As a result, the first and second capacitors C1 and C2 in the final structure described with reference to FIG. 6 may be formed on the second substrate 40.

Figure 7E:
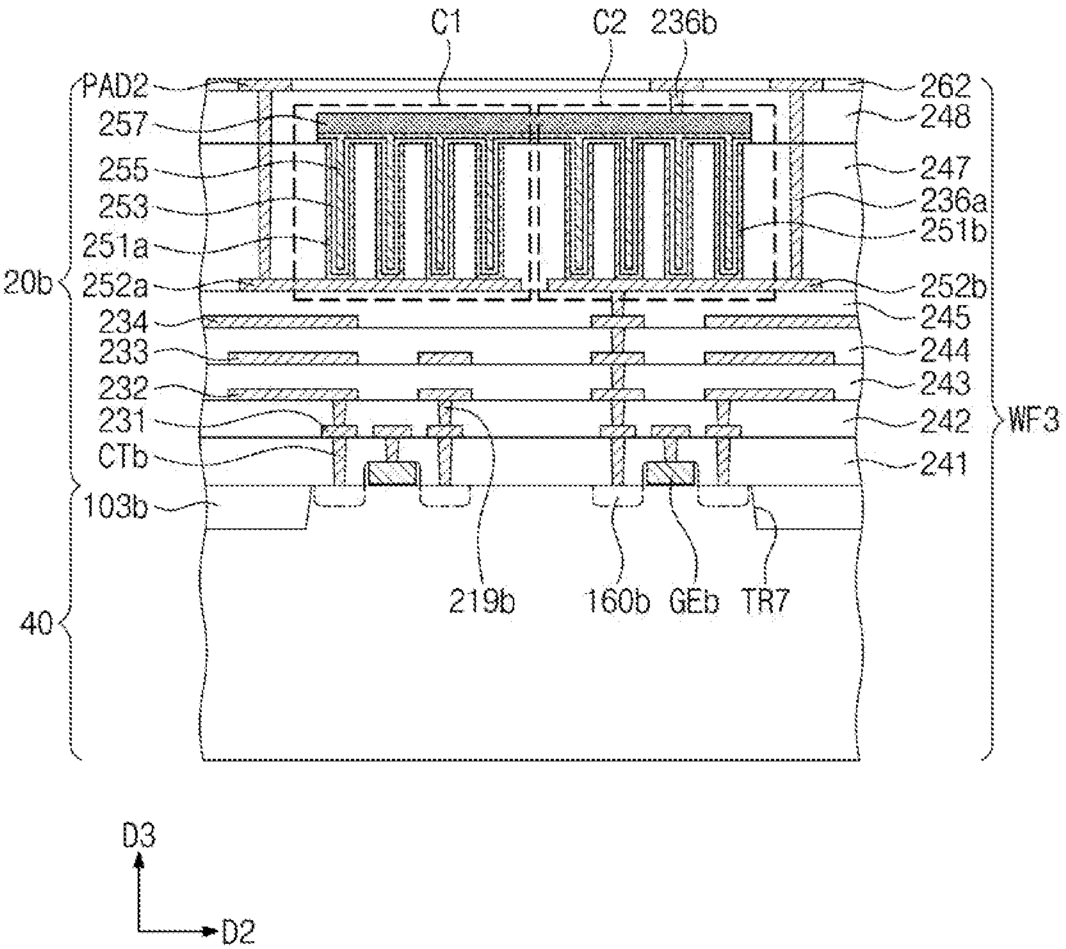

Referring to FIG. 7E, the lower interlayer insulating layer 248 may be formed on the mold insulating layer 247 to cover the first and second capacitors C1 and C2. The first connection pattern 236*a* and the second connection pattern 236*b* may be formed to penetrate the lower interlayer insulating layer 248. The first connection pattern 236*a* may further penetrate the mold insulating layer 247, and may be connected to the first lower pad electrode 252*a* or the second lower pad electrode 252*b*. The second connection pattern 236*b* may be connected to the upper pad electrode 257.

The lower pad insulating layer 262 may be formed on the lower interlayer insulating layer 248. The second conductive pads PAD2 may be formed in the lower pad insulating layer 262. The second conductive pad PAD2 may be connected to one of the first connection pattern 236*a* or the second connection pattern 236*b*. Accordingly, the lower interconnection layer 20*b* on the second substrate 40 may be formed. The second substrate 40 and the lower interconnection layer 20*b* may constitute a third wafer portion WF3. The third wafer portion WF3 may serve as the third semiconductor chip SC3 in the final structure described with reference to FIG. 6.

Figure 7F:
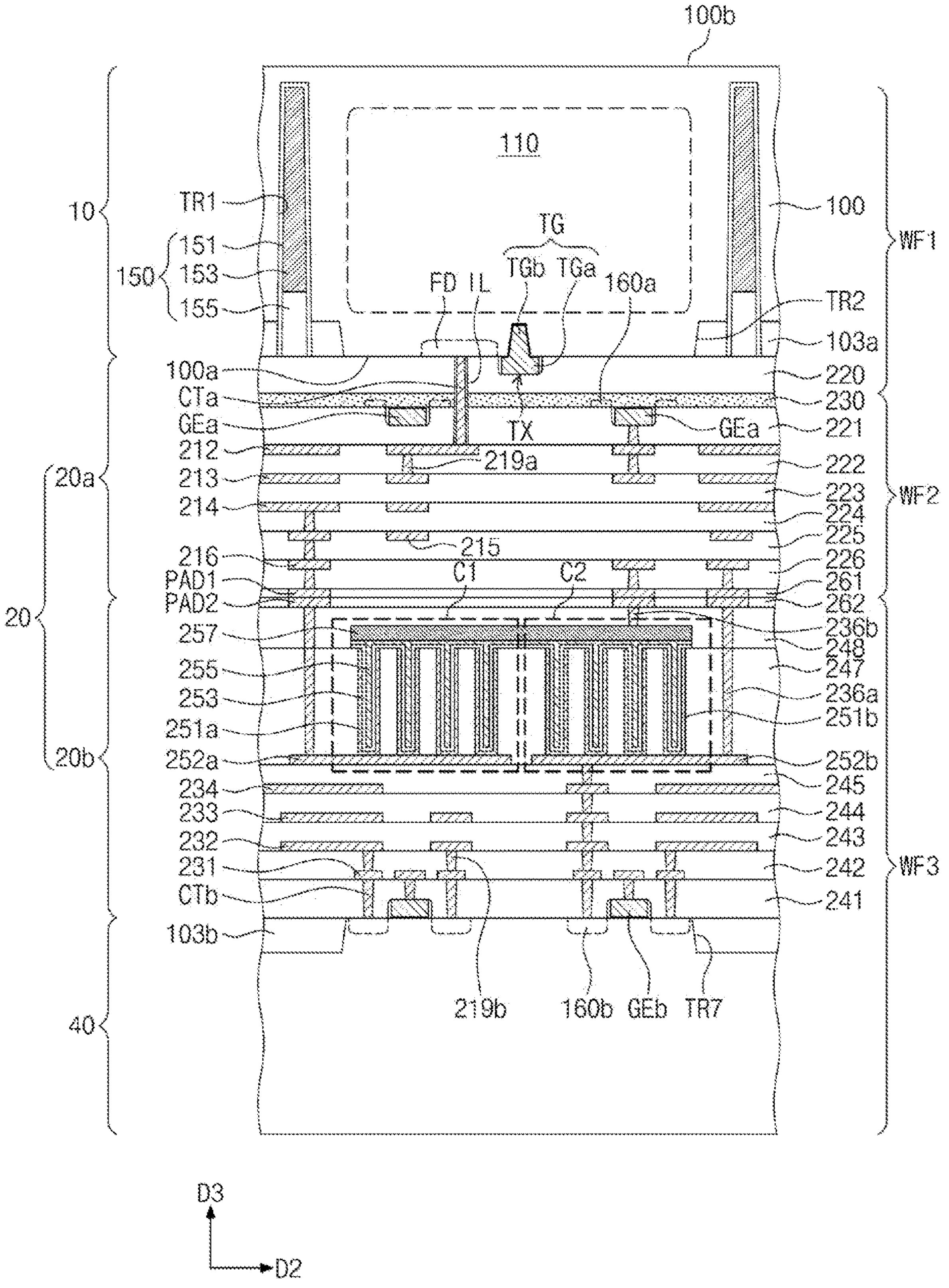

Referring to FIG. 7F, the second wafer portion WF2 described with reference to FIG. 7B may be connected to the third wafer portion WF3 described with reference to FIG. 7E. For example, the first wafer portion WF1 and the second wafer portion WF2 may be flipped over such that the first conductive pad PAD1 is in contact with the second conductive pad PAD2 of the third wafer portion WF3, and then, a thermocompression process may be performed to bond the second wafer portion WF2 to the third wafer portion WF3.

As described above, in an example embodiment, the capacitors C1 and C2 may be formed in the third wafer portion WF3. That is, the capacitors C1 and C2 may be formed in the third wafer portion WF3 through a process that is distinct from a process of forming the first wafer portion WF1 and the second wafer portion WF2. Accordingly, it may be possible to prevent the titanium atoms in the barrier layer of the contact pattern CTa from being diffused into the photoelectric conversion region 110 during a high-temperature process for forming the capacitors C1 and C2 and to reduce a length of the contact pattern CTa. As a result, it may be possible to improve optical characteristics of an image sensor.

Referring back to FIG. 6, a thinning process of removing a portion of the first substrate 100 may be performed to reduce a vertical thickness of the first substrate 100. The thinning process may include grinding or polishing the second surface 100*b* of the first substrate 100 and anisotropically or isotropically etching the second surface 100*b* of the first substrate 100. In an example embodiment, the grinding or polishing process may be performed to remove a portion of the first substrate 100, and then, the anisotropic or isotropic etching process may be performed to remove surface defects from the first substrate 100. The removal may be performed such that the second surface 100*b* of the first substrate 100 may be coplanar with a top surface of the first trench TR1. In addition, a top surface of the second isolation pattern 153 may be exposed to the outside of the first substrate 100 near the second surface 100*b*.

The fixed charge layer 132, the first insulating layer 134, and the second insulating layer 136 may be sequentially formed on the second surface 100*b* of the first substrate 100. The color filters 303 may be formed on the unit pixel regions PX, respectively. The third insulating layer 305 may be formed on the color filters 303. The micro lenses 307 may be formed on the third insulating layer 305 to be overlapped with the unit pixel regions PX, respectively. Next, a sawing process may be performed to divide a structure, in which the first to third wafer portions WF1, WF2, and WF3 are bonded to each other, into a plurality of chips. As a result, the first to third semiconductor chips SC1, SC2, and SC3 may be fabricated.

Figure 8A:
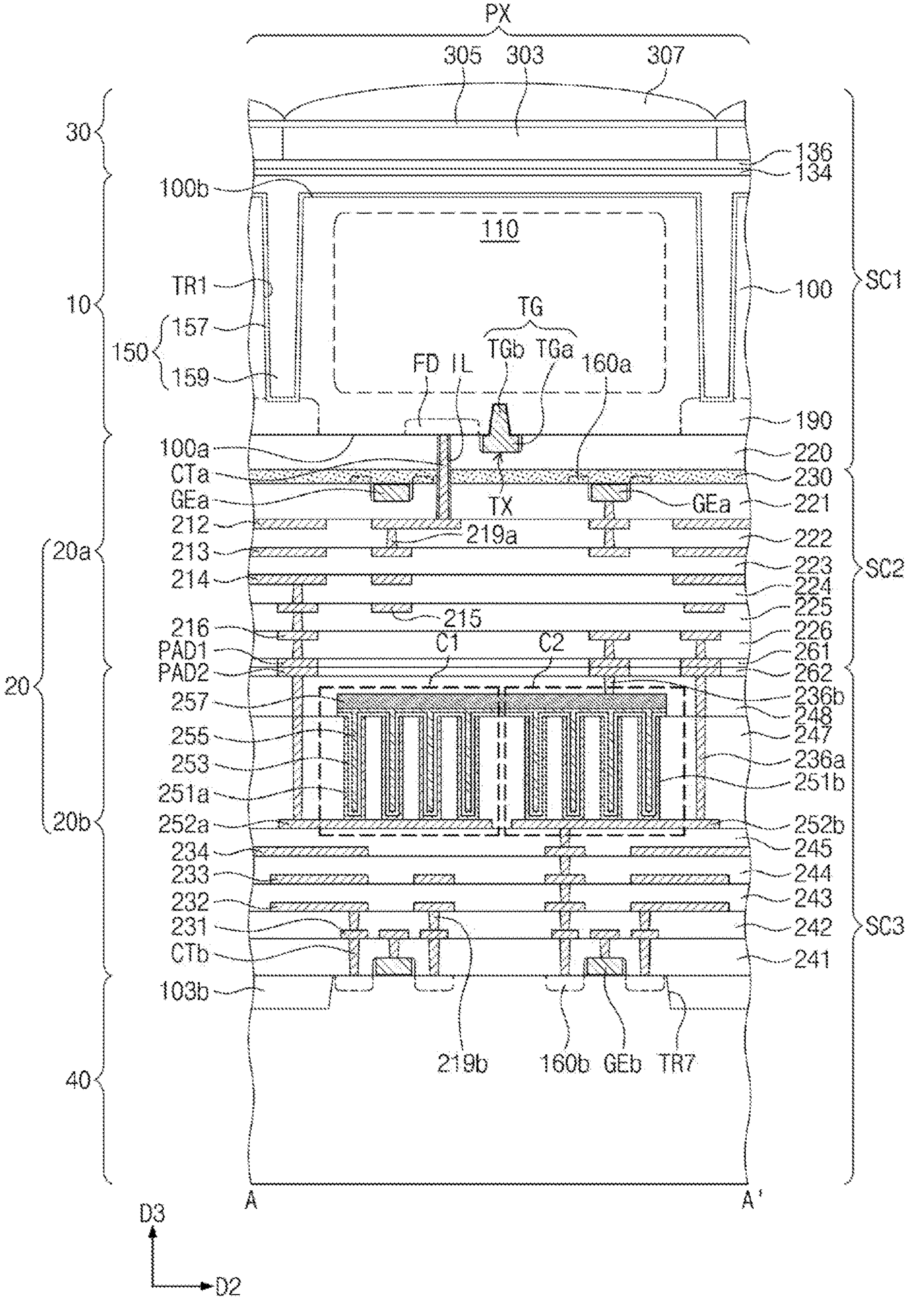
FIGS. 8A to 8C are sectional views, each of which is taken along the line A-A' of FIG. 5 to illustrate an image sensor according to example embodiments.
Figure 8B:
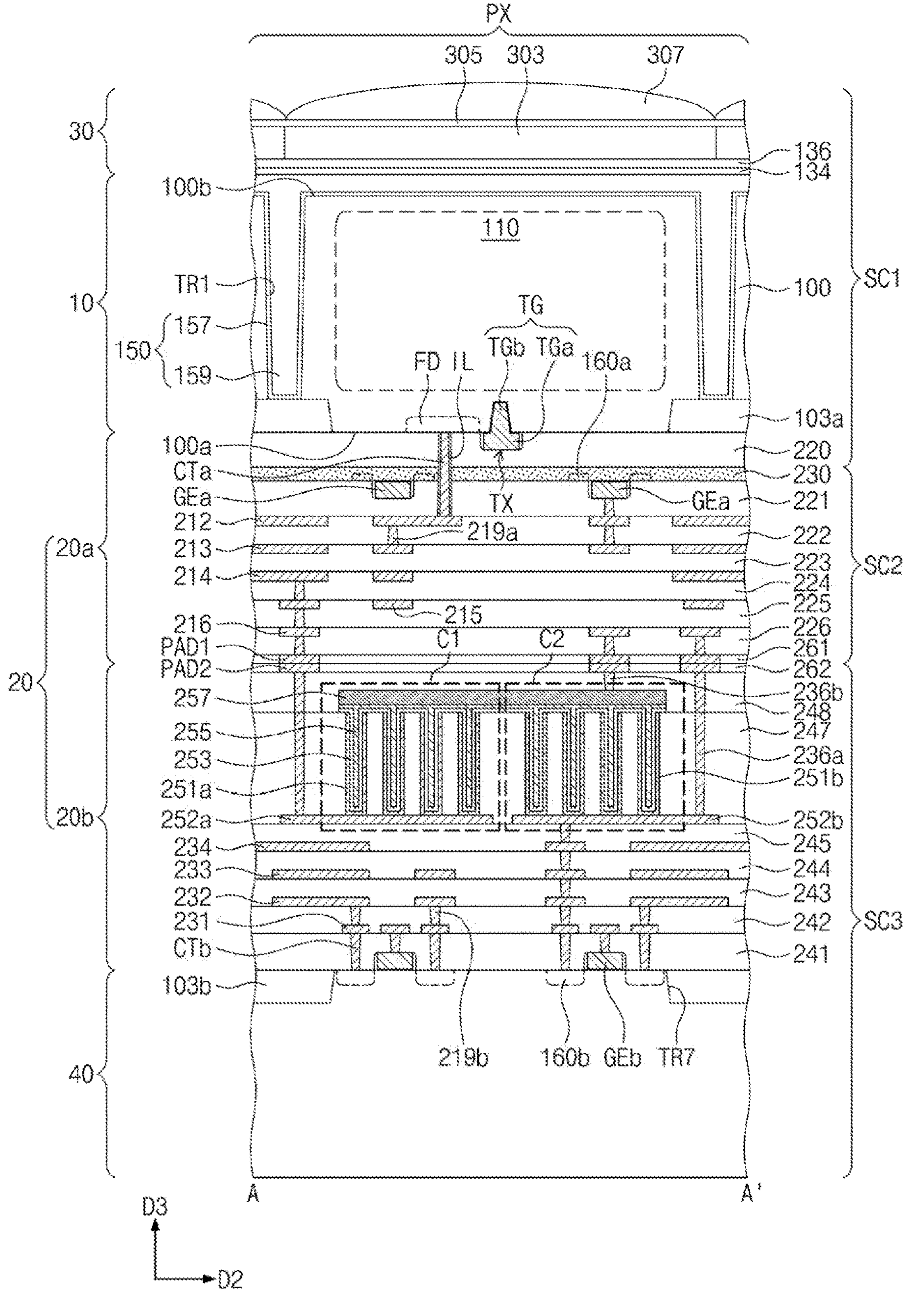
Figure 8C:
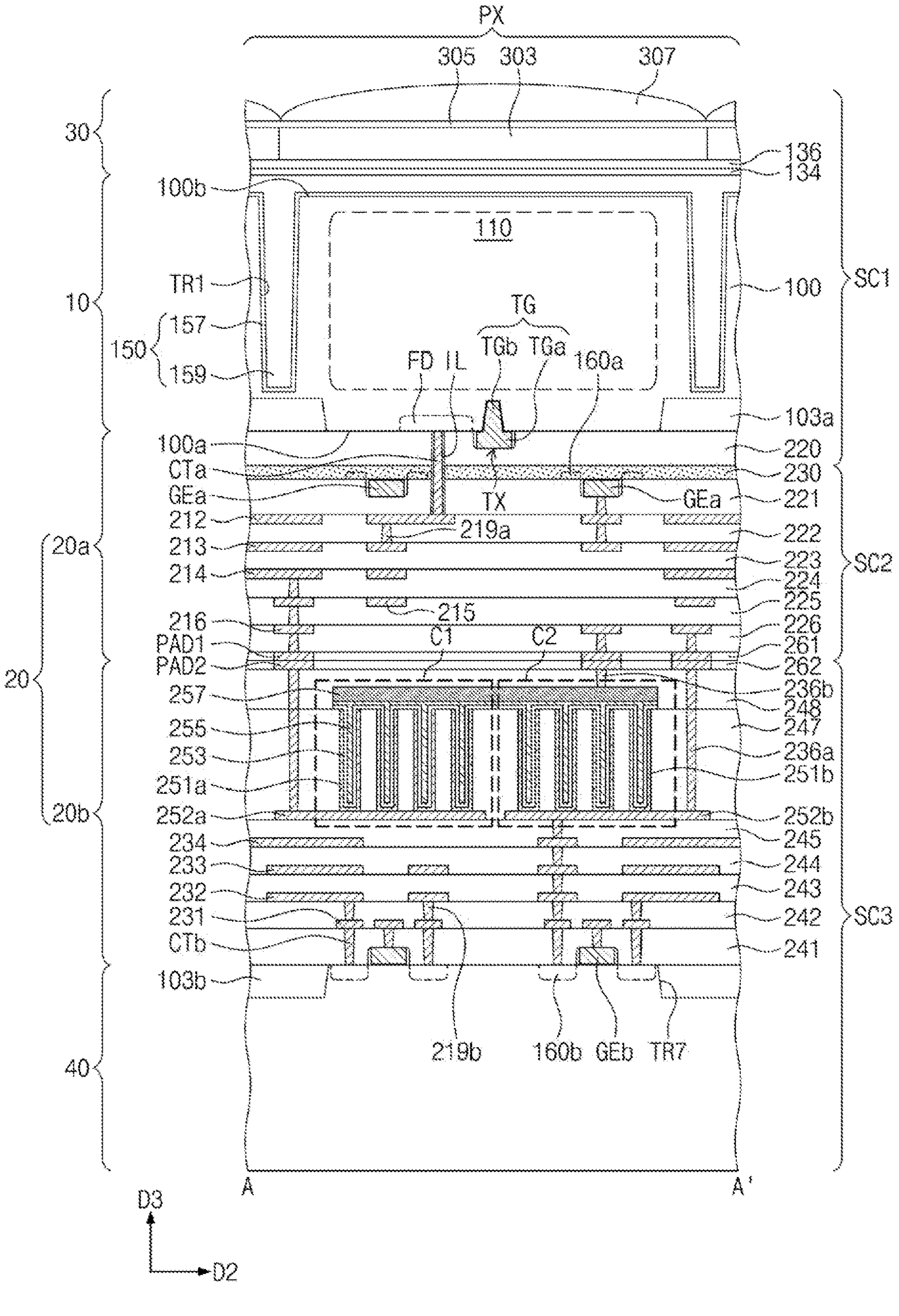

FIGS. 8A to 8C are sectional views, each of which is taken along the line A-A' of FIG. 5 to illustrate an image sensor according to example embodiments. In the following description of the present example embodiment, an element previously described with reference to FIG. 6 may be identified by the same reference number without repeating an overlapping description thereof.

In an example embodiment, referring to FIG. 8A, the pixel isolation pattern 150 may be provided in the first trench TR1. The first trench TR1 may be an empty region that is recessed from the second surface 100*b* of the first substrate 100. The first trench TR1 may have a width that decreases in a direction from the second surface 100*b* of the first substrate 100 toward the first surface 100*a*.

The pixel isolation pattern 150 may include a gapfill fixed charge layer 157, which is conformally provided along an inner surface of the first trench TR1, and a gapfill insulating pattern 159, which is provided on the gapfill fixed charge layer 157. The gapfill fixed charge layer 157 may have negative fixed charges. The gapfill fixed charge layer 157 may be formed of metal oxide or metal fluoride containing at least one metal such as hafnium (Hf), zirconium (Zr), aluminum (Al), tantalum (Ta), titanium (Ti), yttrium (Y), or a lanthanoid. For example, the gapfill fixed charge layer 157 may be a hafnium oxide layer or an aluminum oxide layer. Hole accumulation may occur in the vicinity of the gapfill fixed charge layer 157. Thus, it may be possible to effectively prevent or suppress a dark current issue and a white spot issue from occurring. The gapfill insulating pattern 159 may be formed of or include an insulating material which can be formed with a good step coverage property. For example, the gapfill insulating pattern 159 may be formed of or include silicon oxide. The gapfill fixed charge layer 157 may be extended to a region on the second surface 100*b* of the first substrate 100. The gapfill insulating pattern 159 may also be extended to a region on the second surface 100*b* of the first substrate 100. In the present example embodiment, the fixed charge layer 132 described with reference to FIG. 6 may be omitted.

A doped region 190 may be interposed between the first surface 100*a* of the first substrate 100 and the pixel isolation pattern 150. The doped region 190 may have a first conductivity type (e.g., p-type). In an example embodiment, the doped region 190 may be provided to enclose a bottom surface of the pixel isolation pattern 150.

In an example embodiment, referring to FIG. 8B, the pixel isolation pattern 150 may be substantially the same as the pixel isolation pattern 150 of FIG. 8A, but the first device isolation pattern 103*a* may be provided between the first surface 100*a* of the first substrate 100 and the pixel isolation pattern 150. The first device isolation pattern 103*a* and the pixel isolation pattern 150 may be vertically spaced apart from each other. In other words, a portion of the first substrate 100 may be extended into a region between the first device isolation pattern 103*a* and the pixel isolation pattern 150.

In an example embodiment, referring to FIG. 8C, the pixel isolation pattern 150 may be substantially the same as the pixel isolation pattern 150 of FIG. 8A, but the first device isolation pattern 103*a* may be in contact with the pixel isolation pattern 150. The first device isolation pattern 103*a* may be interposed between the first surface 100*a* of the first substrate 100 and the pixel isolation pattern 150.

Figure 9:
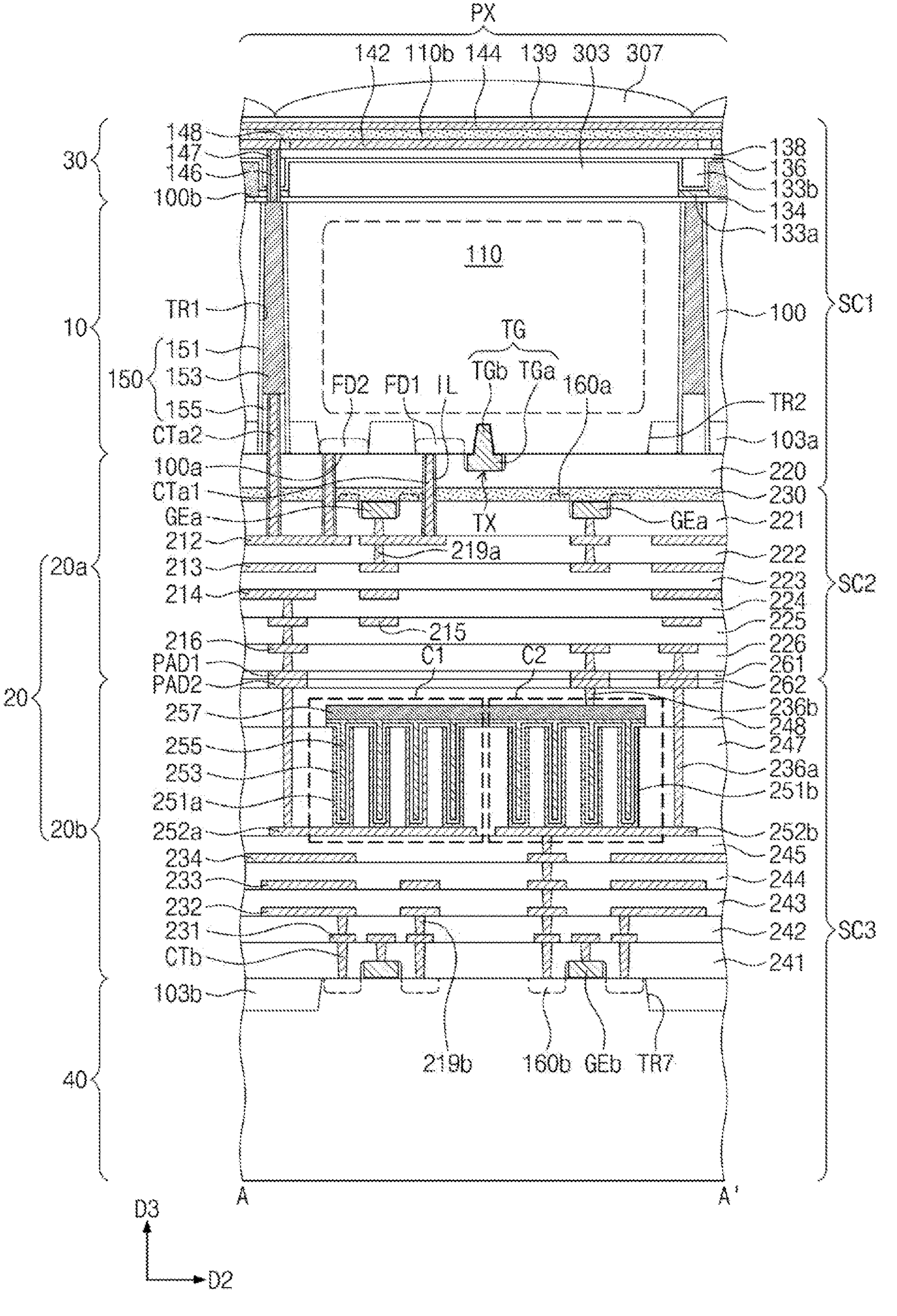
FIG. 9 is a sectional view taken along the line A-A' of FIG. 5 to illustrate an image sensor according to an example embodiment.

FIG. 9 is a sectional view taken along the line A-A' of FIG. 5 to illustrate an image sensor according to an example embodiment. In the following description of the present example embodiment, an element previously described with reference to FIG. 6 may be identified by the same reference number without repeating an overlapping description thereof.

Referring to FIG. 9, a first floating diffusion region FD1 and a second floating diffusion region FD2 may be provided in the first substrate 100 near the first surface 100*a*. The second floating diffusion region FD2 may be spaced apart from the first floating diffusion region FD1 by the first device isolation pattern 103*a*.

The first insulating layer 134 may be provided on the second surface 100*b* of the first substrate 100. The color filters 303 may be disposed on the first insulating layer 134 and for respective ones of the unit pixel regions PX. A light-blocking pattern 133*a* may be disposed on the first insulating layer 134 and between the color filters 303. Side and top surfaces of the color filters 303 and a top surface of the light-blocking pattern 133*a* may be covered with the second insulating layer 136. A space between the color filters 303 may be filled with a low-refractive pattern 133*b*.

A third insulating layer 138 may be provided on the second insulating layer 136 and the low-refractive pattern 133*b*. A pixel electrode 142 may be provided on the third insulating layer 138 and for each of the unit pixel regions PX. An upper insulating pattern 148 may be interposed between the pixel electrodes 142. In an example embodiment, the upper insulating pattern 148 may be formed of or include silicon oxide or silicon nitride. A first photoelectric conversion layer 110*b* may be provided on the pixel electrodes 142. A common electrode 144 may be provided on the first photoelectric conversion layer 110*b*. A passivation layer 139 may be provided on the common electrode 144. The micro lenses 307 may be provided on the passivation layer 139.

The pixel electrode 142 and the common electrode 144 may be formed of or include at least one of indium tin oxide (ITO), indium zinc oxide (IZO), zinc oxide (ZnO), and/or organic transparent conductive materials. In an example embodiment, the first photoelectric conversion layer 110*b* may be an organic photoelectric conversion layer. The first photoelectric conversion layer 110*b* may include a p-type organic semiconductor material and an n-type organic semiconductor material, and in this case, the p- and n-type organic semiconductor materials may be formed to constitute a p-n junction. Alternatively, the first photoelectric conversion layer 110*b* may include quantum dots or a chalcogenide material.

The pixel electrode 142 may be electrically connected to the pixel isolation pattern 150 through a via plug 146. More specifically, the pixel electrode 142 may be electrically connected to the second isolation pattern 153 of the pixel isolation pattern 150. The via plug 146 may be provided to penetrate the third insulating layer 138, the low-refractive pattern 133*b*, the second insulating layer 136, the light-blocking pattern 133*a*, and the first insulating layer 134 and to be in contact with the pixel isolation pattern 150. A side surface of the via plug 146 may be covered with a via insulating pattern 147. The pixel isolation pattern 150 may be electrically connected to the second floating diffusion region FD2 through the first upper interconnection pattern 212 and first and second contact patterns CTa1 and CTa2. The first contact patterns CTa1 may be coupled to at least one of the first gate electrode GEa and the first and second floating diffusion regions FD1 and FD2. A side surface of the first contact pattern CTa1 penetrating the intermediate substrate 230 may be covered with the insulating pattern IL. The second contact pattern CTa2 may be coupled to the second isolation pattern 153. A top surface of the second contact pattern CTa2 may be located at a level higher than a top surface of the first contact pattern CTa1. A side surface of the second contact pattern CTa2 may be covered with the insulating pattern IL.

Figure 10:
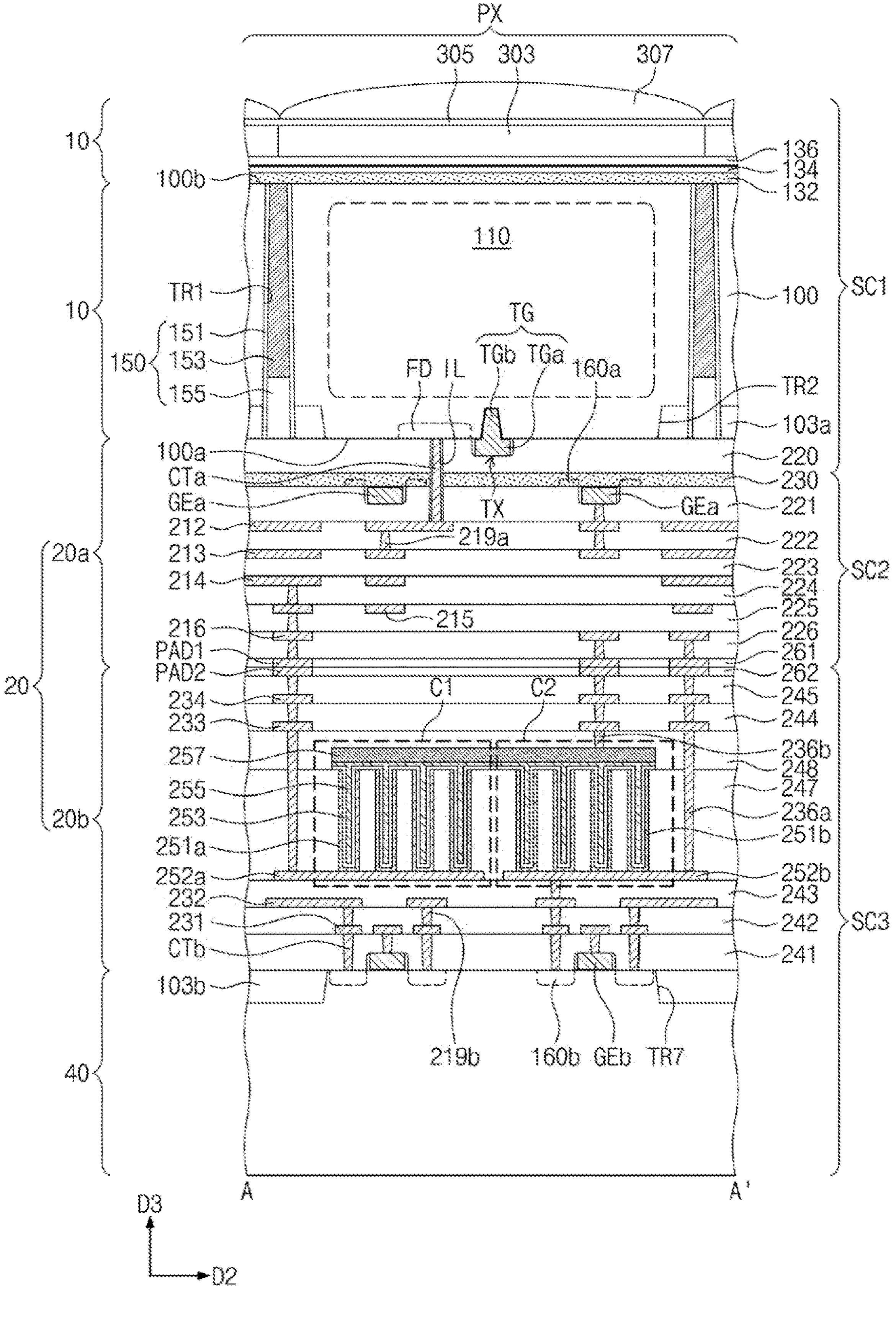
FIG. 10 is a sectional view taken along the line A-A' of FIG. 5 to illustrate an image sensor according to an example embodiment.

FIG. 10 is a sectional view taken along the line A-A' of FIG. 5 to illustrate an image sensor according to an example embodiment. In the following description of the present example embodiment, an element previously described with reference to FIG. 6 may be identified by the same reference number without repeating an overlapping description thereof.

Referring to FIGS. 5 and 10, the first and second lower pad electrodes 252*a* and 252*b* may be provided on the third lower insulating layer 243. The mold insulating layer 247 may be provided on the third lower insulating layer 243 to cover the first and second lower pad electrodes 252*a* and 252*b*. The first and second capacitors C1 and C2 may be disposed in the mold insulating layer 247. The lower interlayer insulating layer 248 may be provided on the mold insulating layer 247 to cover the first and second capacitors C1 and C2. The first and second capacitors C1 and C2 may have substantially the same structure as that described with reference to FIG. 6.

The fourth and fifth lower insulating layers 244 and 245 may be sequentially provided on the lower interlayer insulating layer 248. The second conductive pad PAD2 and the fourth lower interconnection pattern 234 may be connected to each other through the second via 219*b*. The mold insulating layer 247 may be provided between the third lower insulating layer 243 and the fourth lower insulating layer 244.

Figure 11:
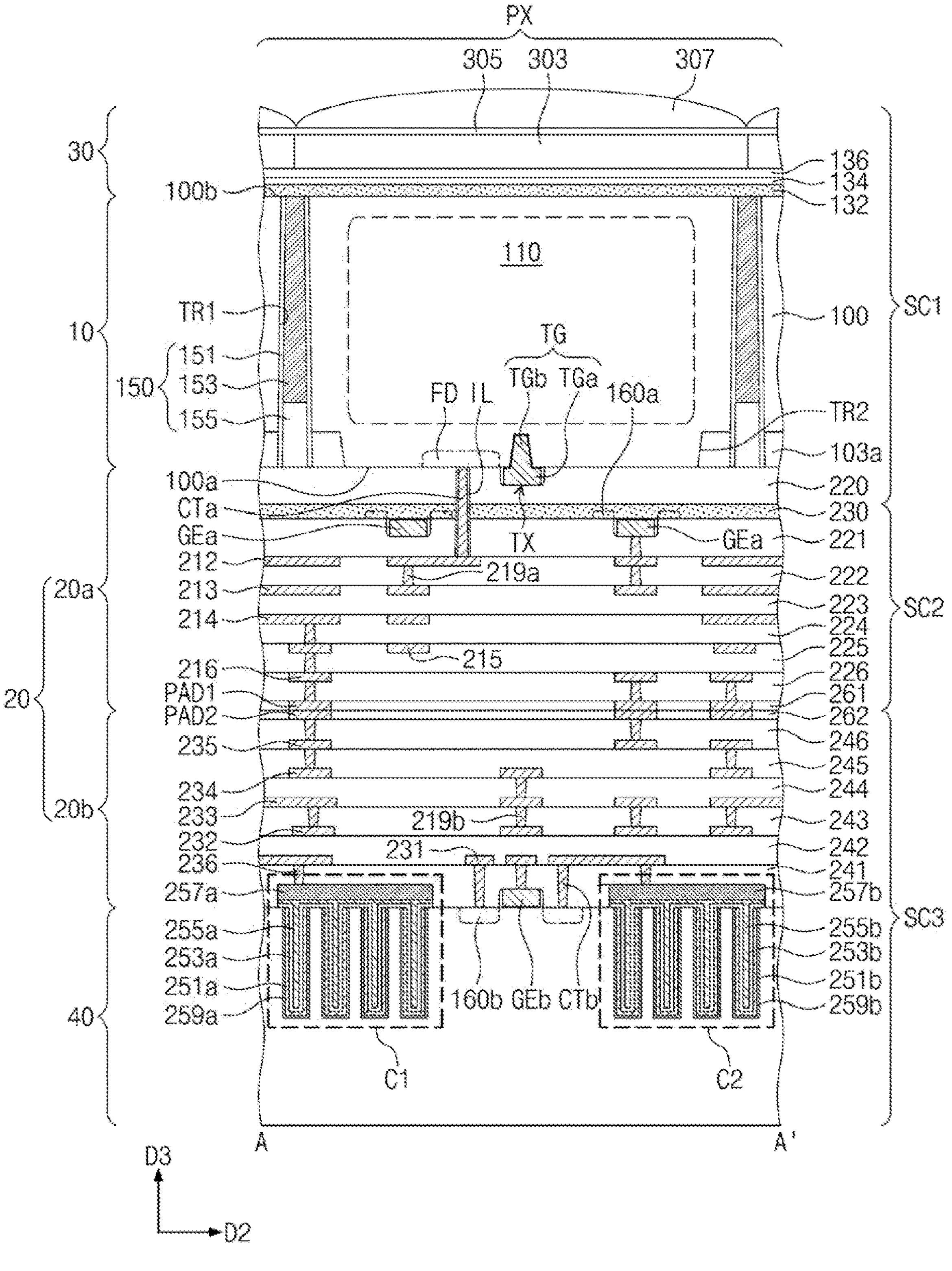
FIG. 11 is a sectional view taken along the line A-A' of FIG. 5 to illustrate an image sensor according to an example embodiment.

FIG. 11 is a sectional view taken along the line A-A' of FIG. 5 to illustrate an image sensor according to an example embodiment. In the following description of the present example embodiment, an element previously described with reference to FIG. 6 may be identified by the same reference number without repeating an overlapping description thereof.

Referring to FIGS. 5 and 11, the mold insulating layer 247 and the lower interlayer insulating layer 248 described with reference to FIG. 6 may be omitted. The first and second capacitors C1 and C2 may be disposed in the second substrate 40.

The second substrate 40 may have a plurality of trenches. A first electrode insulating pattern 259*a* and a second electrode insulating pattern 259*b* may be disposed in the trenches. The first electrode insulating patterns 259*a* may be spaced apart from each other. The second electrode insulating patterns 259*b* may be spaced apart from each other. The first bottom electrode 251*a* may be disposed on the first electrode insulating pattern 259*a*. The second bottom electrode 251*b* may be disposed on the second electrode insulating pattern 259*b*. In an example embodiment, each of the first and second electrode insulating patterns 259*a* and 259*b* may be provided to conformally cover an inner surface of the trench or to have a cylinder shape. Each of the first and second bottom electrodes 251*a* and 251*b* may be provided to conformally cover an inner surface of a corresponding one of the first and second electrode insulating patterns 259*a* and 259*b* or to have a cylinder shape. Top surfaces of the first and second bottom electrodes 251*a* and 251*b* may be located at substantially the same level as the top surface of the second substrate 40.

A first dielectric layer 253*a* and a first top electrode 255*a* may be sequentially disposed on the second substrate 40 to conformally cover the first bottom electrodes 251*a*. The first upper pad electrode 257*a* may be disposed on the first top electrode 255*a*.

A second dielectric layer 253*b* and a second top electrode 255*b* may be sequentially disposed on the second substrate 40 to conformally cover the second bottom electrodes 251*b*. A second upper pad electrode 257*b* may be disposed on the second top electrode 255*b*.

The first electrode insulating patterns 259*a*, the first bottom electrodes 251*a*, the first dielectric layer 253*a*, the first top electrode 255*a*, and the first upper pad electrode 257*a* may constitute the first capacitor C1. The second electrode insulating patterns 259*b*, the second bottom electrodes 251*b*, the second dielectric layer 253*b*, the second top electrode 255*b*, and the second upper pad electrode 257*b* may constitute the second capacitor C2.

The first lower insulating layer 241 may cover the second gate electrode GEb and the first and second capacitors C1 and C2. A connection pattern 236 may be provided to penetrate the first lower insulating layer 241 and to be in contact with the first upper pad electrode 257*a* or the second upper pad electrode 257*b*.

The lower interconnection layer 20*b* may further include a sixth lower insulating layer 246 on the fifth lower insulating layer 245. Fifth lower interconnection patterns 235 may be disposed in the sixth lower insulating layer 246. The fifth lower interconnection pattern 235 may be connected to the second conductive pad PAD2 through the second via 219*b*.

Figure 12:
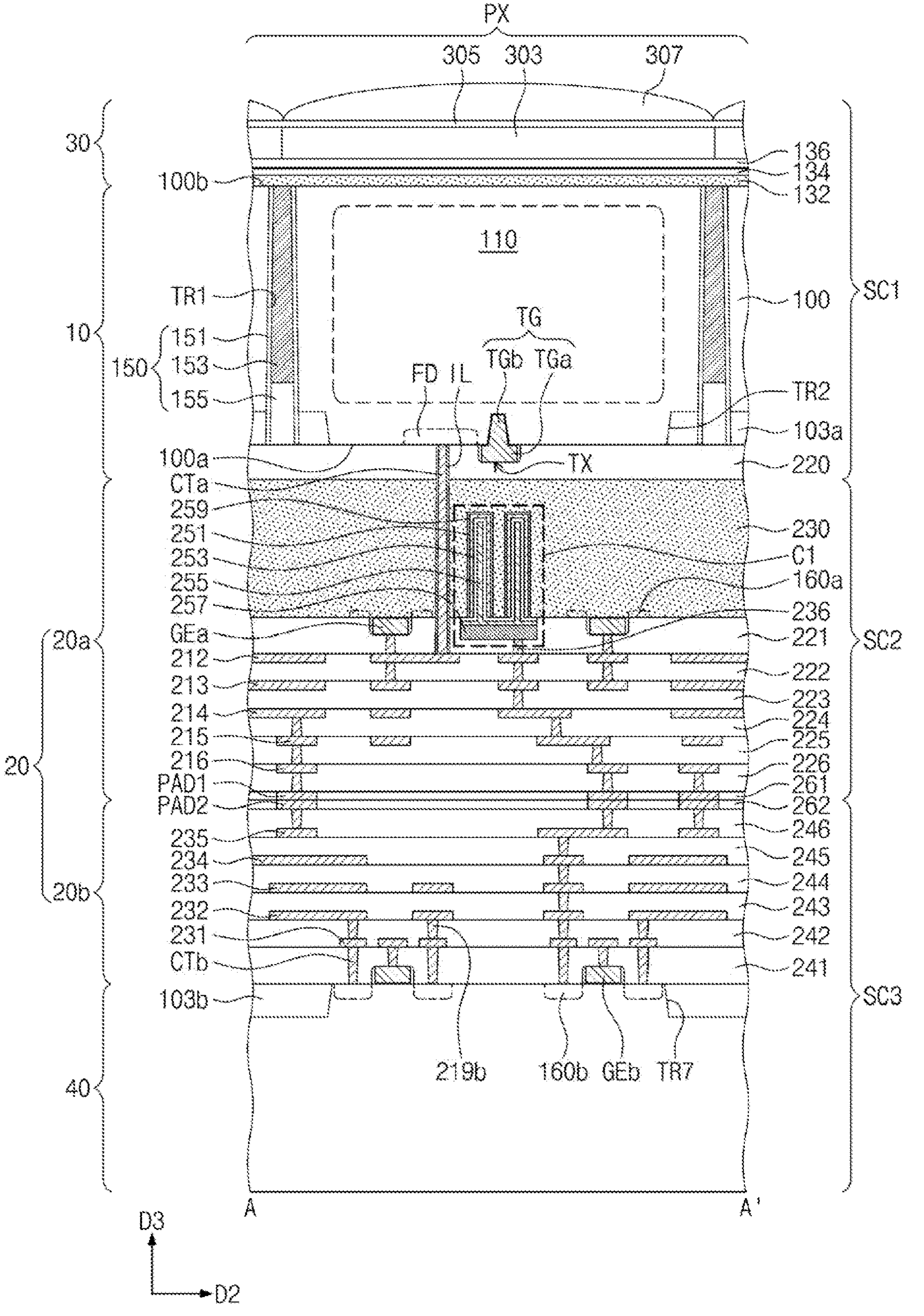
FIG. 12 is a sectional view illustrating an image sensor according to an example embodiment.

FIG. 12 is a sectional view illustrating an image sensor according to an example embodiment. In the following description of the present example embodiment, an element previously described with reference to FIG. 6 may be identified by the same reference number without repeating an overlapping description thereof.

Referring to FIG. 12, the mold insulating layer 247 and the lower interlayer insulating layer 248 described with reference to FIG. 6 may be omitted. The capacitor C1 may be disposed in the intermediate substrate 230.

The intermediate substrate 230 may have a plurality of trenches. Electrode insulating patterns 259 may be disposed in the trenches, respectively. Bottom electrodes 251 may be disposed on the electrode insulating patterns 259, respectively. Each of the electrode insulating patterns 259 may be provided to conformally cover inner surfaces of the trenches or to have a cylinder shape. Each of the bottom electrodes 251 may be provided to conformally cover an inner surface of a corresponding one of the electrode insulating patterns 259 or to have a cylinder shape. Bottom surfaces of the bottom electrodes 251 may be located at substantially the same level as the bottom surface of the intermediate substrate 230.

The dielectric layer 253 and the top electrode 255 may be sequentially disposed to conformally cover the bottom electrodes 251. The upper pad electrode 257 may be disposed on the top electrode 255.

The first upper insulating layer 221 may cover the first gate electrode GEa and the first capacitor C1. The connection pattern 236 may be provided to penetrate the first upper insulating layer 221 and to be in contact with the upper pad electrode 257. The connection pattern 236 may connect the upper pad electrode 257 to the first upper interconnection pattern 212.

The lower interconnection layer 20*b* may further include the sixth lower insulating layer 246 on the fifth lower insulating layer 245. The fifth lower interconnection pattern 235 may be disposed in the sixth lower insulating layer 246. The fifth lower interconnection pattern 235 may be connected to the second conductive pad PAD2 through the second via 219*b*.

According to an example embodiment, capacitors may be formed in a lower semiconductor chip through a process that is distinct from a process of forming an upper semiconductor chip and an intermediate semiconductor chip. Accordingly, it may be possible to prevent titanium atoms in a barrier layer of a contact pattern from being diffused into a photoelectric conversion region during a high-temperature process for forming the capacitors and thereby to reduce a length of the contact pattern. As a result, it may be possible to improve optical characteristics of an image sensor.

As described above, embodiments relate to an image sensor configured to perform a global shutter operation. Embodiments may provide an image sensor with improved optical property.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:

a first substrate having a bottom surface and a top surface, which are opposite to each other, the first substrate including a floating diffusion region at the bottom surface of the first substrate and within the first substrate;

a second substrate below the bottom surface of the first substrate;

an intermediate substrate between the first substrate and the second substrate;

a first transistor on a bottom surface of the intermediate substrate;

a contact pattern electrically connecting the first transistor to the floating diffusion region;

an upper interconnection layer on the bottom surface of the intermediate substrate;

a lower semiconductor chip below the upper interconnection layer, the lower semiconductor chip including:

a lower interconnection layer, and the second substrate, wherein the lower interconnection layer is between the upper interconnection layer and the second substrate;

a first conductive pad at a bottom surface of the upper interconnection layer, the first conductive pad being bonded to a second conductive pad at a top surface of the lower interconnection layer, wherein the first conductive pad and the second conductive pad electrically connect the upper interconnection layer to the lower interconnection layer; and a capacitor above the second substrate and below the upper interconnection layer, wherein the contact pattern penetrates the intermediate substrate and contacts the floating diffusion region, and wherein the capacitor is in the lower semiconductor chip and the capacitor is closer to the second substrate than the second conductive pad is to the second substrate.

2. The image sensor as claimed in claim 1, wherein the capacitor includes:

cylindrical bottom electrodes;

a top electrode on the cylindrical bottom electrodes;

a dielectric layer between the cylindrical bottom electrodes and the top electrode; and an upper pad electrode on the top electrode.

3. The image sensor as claimed in claim 1, wherein:

the lower interconnection layer includes sequentially-stacked lower insulating layers, a mold insulating layer on the lower insulating layers, and lower interconnection patterns in the lower insulating layers, and the capacitor is in the mold insulating layer.

4. The image sensor as claimed in claim 1, wherein:

the lower interconnection layer includes first and second lower insulating layers, a mold insulating layer between the first and second lower insulating layers, and lower interconnection patterns in the first and second lower insulating layers, and the capacitor is in the mold insulating layer.

5. The image sensor as claimed in claim 1, wherein:

the upper interconnection layer includes sequentially-stacked upper insulating layers and upper interconnection patterns in the upper insulating layers, the intermediate substrate includes at least one of silicon, silicon germanium, silicon carbide, or organic materials, and each of the upper insulating layers includes silicon oxide.

6. The image sensor as claimed in claim 1, wherein:

the first substrate includes unit pixel regions, each of which includes a photoelectric conversion region, and the capacitor vertically overlaps the photoelectric conversion region.

7. The image sensor as claimed in claim 1, wherein the first transistor includes an impurity region in the intermediate substrate.

8. The image sensor as claimed in claim 1, further comprising an insulating pattern covering a side surface of the contact pattern.

9. The image sensor as claimed in claim 1, further comprising a second transistor on a top surface of the second substrate, wherein:

the top surface of the second substrate faces the bottom surface of the first substrate, and the second transistor is electrically connected to the capacitor.

10. The image sensor as claimed in claim 1, wherein:

the first conductive pad is in the upper interconnection layer and the second conductive pad is in the lower interconnection layer, and the first conductive pad is in contact with the second conductive pad.

11. An image sensor, comprising:

a first substrate having a bottom surface and a top surface, which are opposite to each other, the first substrate including unit pixel regions that each include a floating diffusion region at the bottom surface of the first substrate and within the first substrate;

an intermediate substrate below the bottom surface of the first substrate;

a transistor on a bottom surface of the intermediate substrate and electrically connected to the floating diffusion region through a contact pattern;

an upper interconnection layer below the intermediate substrate;

a lower semiconductor chip below the upper interconnection layer, the lower semiconductor chip including a lower interconnection layer electrically connected to the upper interconnection layer, and a second substrate below the lower interconnection layer; and a first capacitor in the lower semiconductor chip, wherein the contact pattern penetrates the intermediate substrate and has a side surface covered with an insulating pattern, wherein the upper interconnection layer includes a first conductive pad at a bottom surface of the upper interconnection layer adjacent to an upper surface of the lower interconnection layer, wherein the lower interconnection layer includes a second conductive pad at a top surface of the lower interconnection layer adjacent to a bottom surface of the upper interconnection layer, and wherein the first conductive pad and the second conductive pad are in contact with each other.

12. The image sensor as claimed in claim 11, wherein the first capacitor is closer to the second substrate than the second conductive pad is to the second substrate.

13. The image sensor as claimed in claim 11, wherein the first capacitor is in the second substrate.

14. The image sensor as claimed in claim 11, wherein:

the lower interconnection layer includes sequentially-stacked lower insulating layers, a mold insulating layer on the lower insulating layers, and lower interconnection patterns in the lower insulating layers, and the first capacitor is in the mold insulating layer.

15. The image sensor as claimed in claim 11, further comprising a second capacitor spaced apart from the first capacitor, wherein:

the first capacitor and the second capacitor include first bottom electrodes and second bottom electrodes, respectively, and the first capacitor and the second capacitor share a dielectric layer on the first and second bottom electrodes, a top electrode on the dielectric layer, and a top electrode pad on the top electrode.

16. An image sensor, comprising:

a first substrate having a bottom surface and a top surface, which are opposite to each other, the first substrate including a pixel array region, an optical black region, and a pad region;

a pixel isolation pattern on the pixel array region and in the first substrate to define unit pixel regions, the pixel isolation pattern including a first isolation pattern and a second isolation pattern interposed between the first isolation pattern and the first substrate;

a photoelectric conversion region in each of the unit pixel regions;

a floating diffusion region in each of the unit pixel regions and at the bottom surface of the first substrate and within the first substrate;

a transfer gate on the bottom surface of the first substrate;

an intermediate substrate below the bottom surface of the first substrate;

a first transistor on a bottom surface of the intermediate substrate, the first transistor including a first impurity region in the intermediate substrate;

an upper interconnection layer below the intermediate substrate, the upper interconnection layer including sequentially-stacked upper insulating layers and upper interconnection patterns in the upper insulating layers;

a contact pattern electrically connecting the first transistor to the floating diffusion region, the contact pattern penetrating the intermediate substrate and having a side surface covered with an insulating pattern;

an anti-reflection layer on the top surface of the first substrate;

a color filter on the anti-reflection layer;

a micro lens on the color filter;

a lower semiconductor chip below the upper interconnection layer, the lower semiconductor chip including:

a lower interconnection layer below the upper interconnection layer, and a second substrate below the lower interconnection layer, the second substrate including a second transistor on a top surface of the second substrate, conductive pads electrically connecting the upper interconnection layer to the lower interconnection layer, the conductive pads including a first conductive pad at a bottom surface of the upper interconnection layer and a second conductive pad at a top surface of the lower interconnection layer;

and a capacitor in the lower interconnection layer of the lower semiconductor chip, the capacitor being closer to the second substrate than the second conductive pad is to the second substrate, the capacitor including:

bottom electrodes;

a top electrode on the bottom electrodes;

a dielectric layer between the bottom electrodes and the top electrode; and an upper pad electrode on the top electrode.

17. The image sensor as claimed in claim 16, wherein the first conductive pad and the second conductive pad are in contact with each other.

18. The image sensor as claimed in claim 16, wherein:

the capacitor further includes a lower pad electrode electrically connected to the bottom electrodes, and the bottom electrodes are cylindrical, and are arranged in a zigzag shape on the lower pad electrode when viewed in a plan view.

19. The image sensor as claimed in claim 16, wherein the capacitor vertically overlaps the photoelectric conversion region.

20. The image sensor as claimed in claim 16, wherein:

the intermediate substrate includes at least one of silicon, silicon germanium, silicon carbide, or organic materials, and each of the upper insulating layers includes silicon oxide.

* * * * *